United States Patent
Uejima

(10) Patent No.: US 7,579,636 B2
(45) Date of Patent: Aug. 25, 2009

(54) MIS-TYPE FIELD-EFFECT TRANSISTOR

(75) Inventor: Kazuya Uejima, Tokyo (JP)

(73) Assignee: NEC Corporation, Tokyo (JP)

( * ) Notice: Subject to any disclaimer, the term of this patent is extended or adjusted under 35 U.S.C. 154(b) by 380 days.

(21) Appl. No.: 10/585,576

(22) PCT Filed: Dec. 28, 2004

(86) PCT No.: PCT/JP2004/019589

§ 371 (c)(1),
(2), (4) Date: Aug. 23, 2006

(87) PCT Pub. No.: WO2005/067058

PCT Pub. Date: Jul. 21, 2005

(65) Prior Publication Data

US 2008/0296614 A1    Dec. 4, 2008

(30) Foreign Application Priority Data

Jan. 8, 2004    (JP) .............................. 2004-002841

(51) Int. Cl.
*H01L 29/778* (2006.01)
*H01L 31/062* (2006.01)

(52) U.S. Cl. ........................ 257/288; 257/190; 257/285; 257/349; 257/616; 257/E29.246

(58) Field of Classification Search ................. 257/288, 257/616, 192, 190, 285, 349, E29.246
See application file for complete search history.

(56) References Cited

U.S. PATENT DOCUMENTS

| | | | |
|---|---|---|---|
| 6,190,975 B1 | 2/2001 | Kubo et al. | |
| 6,303,446 B1 * | 10/2001 | Weiner et al. | 438/299 |
| 6,461,945 B1 * | 10/2002 | Yu | 438/510 |
| 6,492,680 B1 * | 12/2002 | Ishii et al. | 257/344 |
| 6,633,066 B1 * | 10/2003 | Bae et al. | 257/347 |

(Continued)

FOREIGN PATENT DOCUMENTS

EP    1 174 928 A1    1/2002

(Continued)

OTHER PUBLICATIONS

J.L. Hoyt et al., "Strained Silicon MOSFET Technology," IEDM 2002, pp. 23-26.

(Continued)

*Primary Examiner*—Thanh V Pham
*Assistant Examiner*—Duy T Nguyen
(74) *Attorney, Agent, or Firm*—Foley & Lardner LLP

(57) ABSTRACT

A strained Si layer 2 is epitaxially grown on a base SiGe layer 1, and a gate insulating film 3a and a gate electrode 4a are formed. An impurity is then ion-implanted (FIG. 2A) into the base SiGe layer 1 and the strained Si layer 2 using the gate electrode 4a as a mask, heat treatment is performed for activation, and a source/drain region 6 is formed (FIGS. 2B and 2C). In this instance, the film thickness of the strained Si layer 2 is set to $2T_p$, where $T_p$ ($=R_p$) is the depth having the maximum concentration of the impurity in the source/drain region 6 of the finished MISFET.

17 Claims, 29 Drawing Sheets

U.S. PATENT DOCUMENTS

| | | | |
|---|---|---|---|
| 7,141,477 B2 * | 11/2006 | Noda | 438/305 |
| 2002/0011617 A1 * | 1/2002 | Kubo et al. | 257/301 |
| 2002/0058385 A1 * | 5/2002 | Noda | 438/305 |
| 2002/0179946 A1 * | 12/2002 | Hara et al. | 257/288 |
| 2003/0102490 A1 * | 6/2003 | Kubo et al. | 257/192 |
| 2003/0122203 A1 * | 7/2003 | Nishinohara et al. | 257/402 |
| 2003/0134459 A1 * | 7/2003 | Tanaka et al. | 438/151 |
| 2003/0227029 A1 * | 12/2003 | Lochtefeld et al. | 257/200 |
| 2004/0070051 A1 * | 4/2004 | Sugiyama et al. | 257/616 |
| 2004/0115916 A1 * | 6/2004 | Lochtefeld et al. | 438/597 |
| 2004/0135210 A1 | 7/2004 | Noguchi et al. | |
| 2004/0241958 A1 * | 12/2004 | Guarini et al. | 438/455 |
| 2005/0139860 A1 * | 6/2005 | Snyder et al. | 257/155 |

FOREIGN PATENT DOCUMENTS

| | | |
|---|---|---|
| JP | 10-106966 | 4/1998 |
| JP | 10-214906 | 8/1998 |
| JP | 10-270685 | 10/1998 |
| JP | 2000-286418 | 10/2000 |
| JP | 2001-217433 | 8/2001 |
| JP | 2002-237590 A | 8/2002 |

OTHER PUBLICATIONS

M. Tamura et al., "Secondary Defects in 1-10 keV As- and BF2-implanted Si," International Conference on Ion Implantation Technology Proceedings, pp. 744-747.

H.C. -H. Wang et al., "Substrate-Strained Silicon Technology: Process Integration," IEDM 2003, pp. 61-64.

Applied Physics, vol. 65, No. 11, pp. 1131-1134, 1996.

M. Tamura et al., "Secondary Defects in 1-10 keV As- and BF2-implanted Si," International Conference on Ion Implantation Technology Proceedings, pp. 744-747, 1999.

* cited by examiner

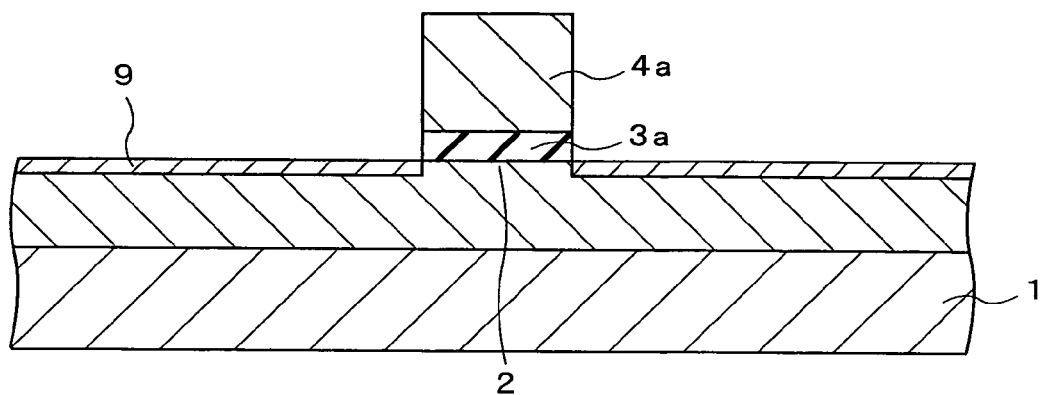
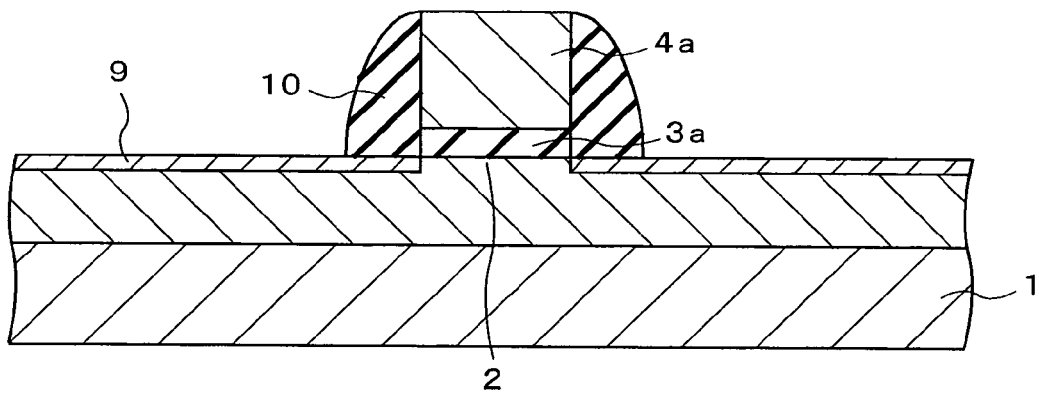
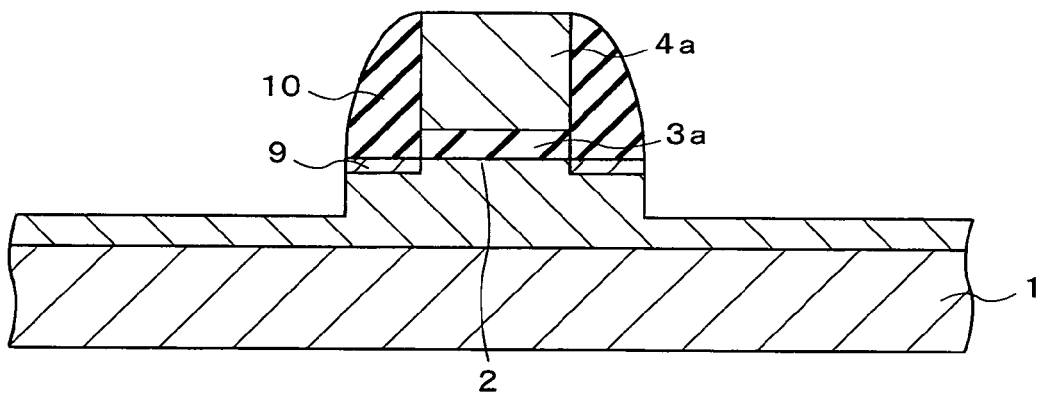

FIG. 24 CONTINUED
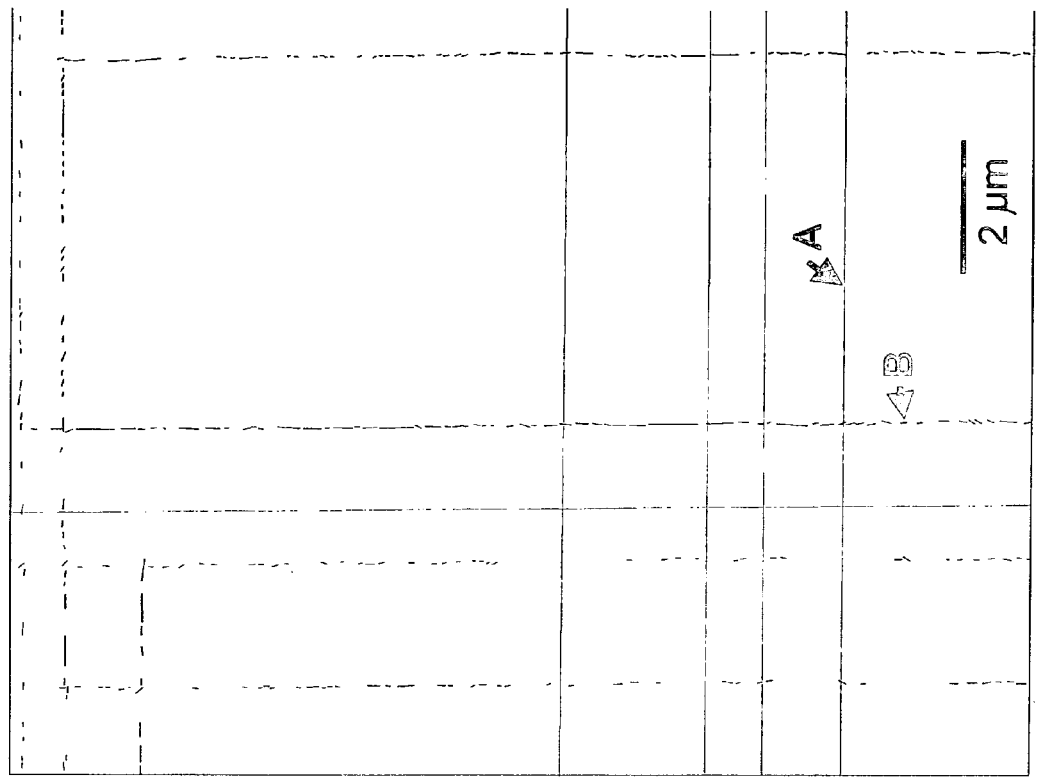
(b)' PLANAR TEM IMAGE
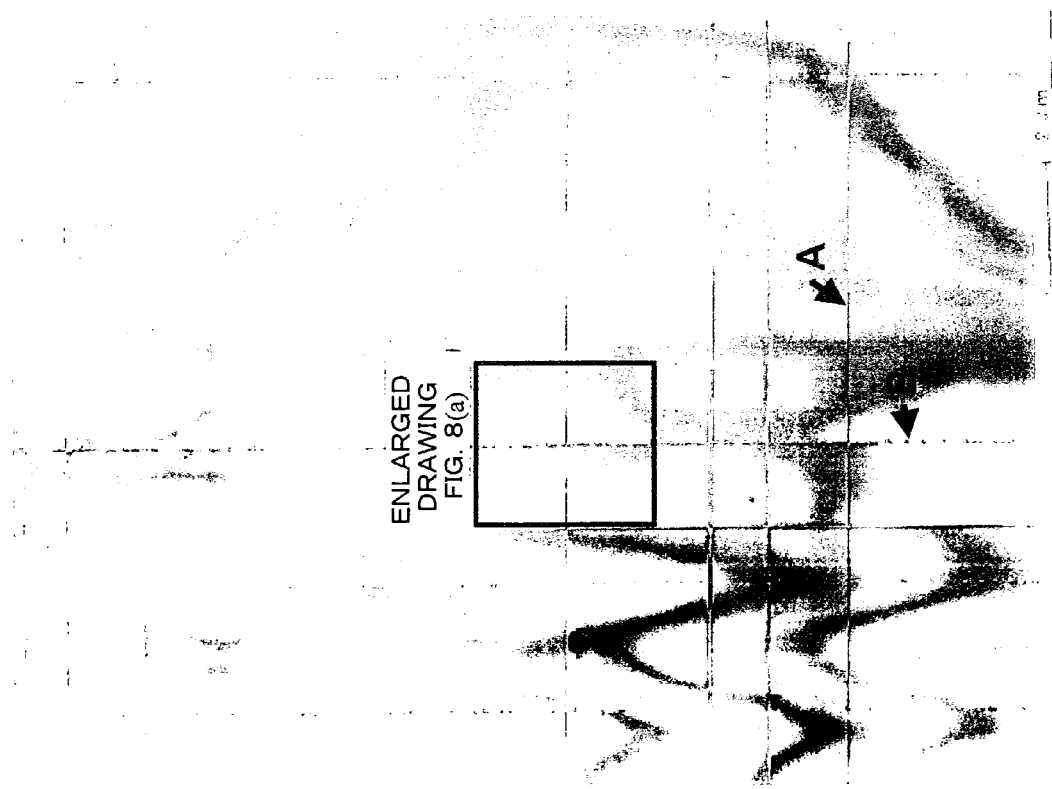
(b) PLANAR TEM IMAGE

CRYSTAL SUBSTRATE

ATOMS OF IMPLANTED IMPURITY

AMORPHOUS LAYER

HOLES

INTERSTITIAL ATOMS

ION IMPLANTATION

HEAT TREATMENT

SURPLUS ATOMS

HEAT TREATMENT2

REGION THAT WAS AMORPHOUS LAYER

DISLOCATION LOOP

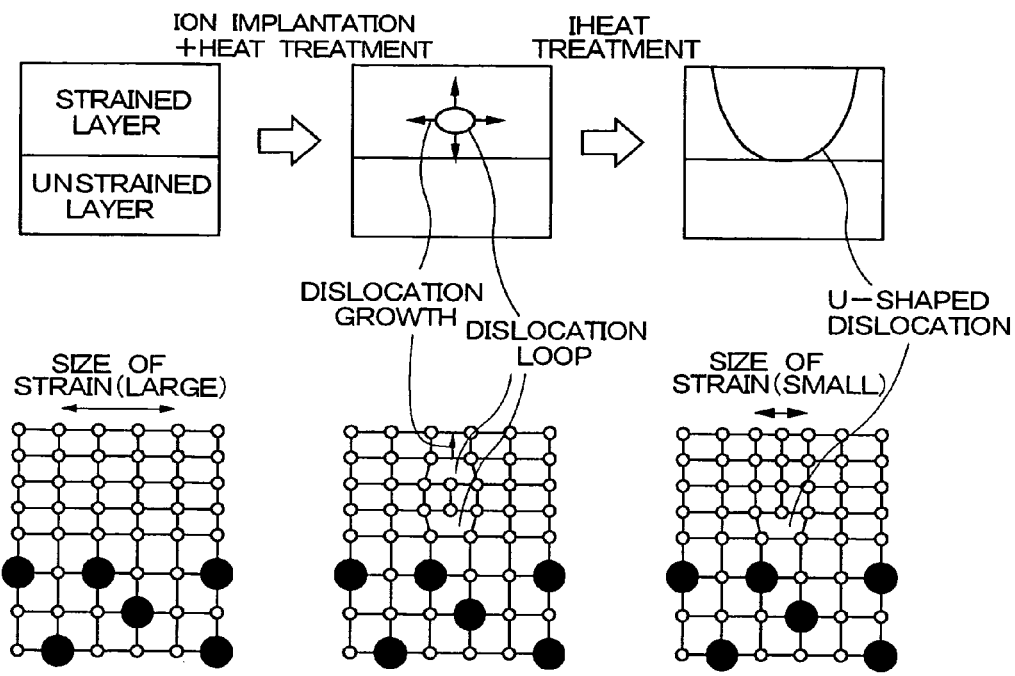
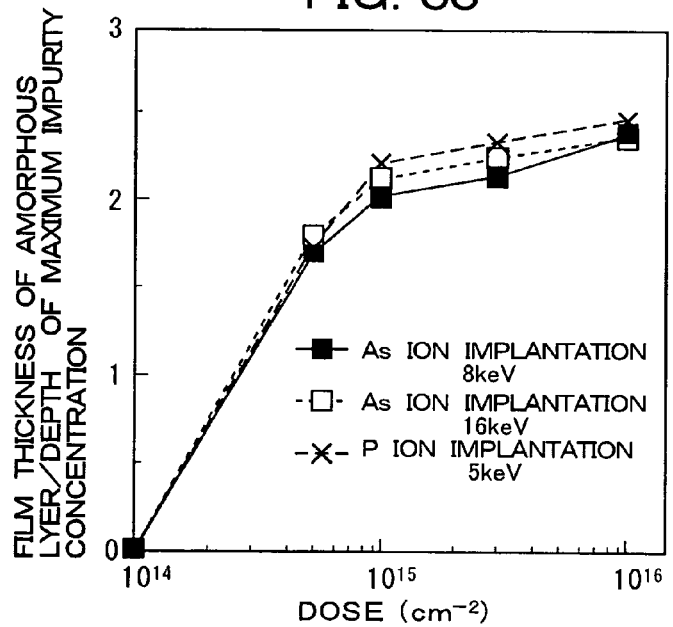

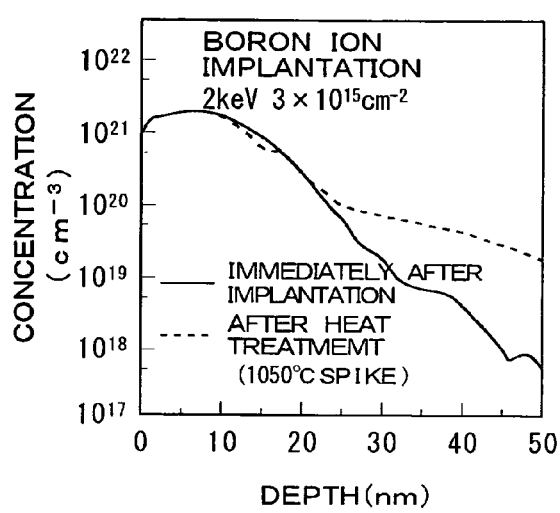
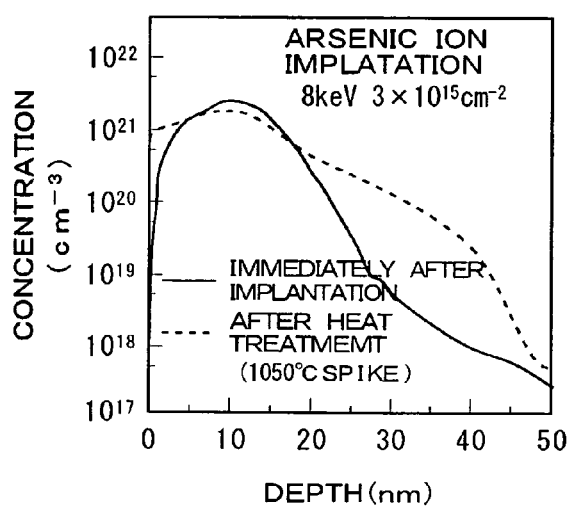

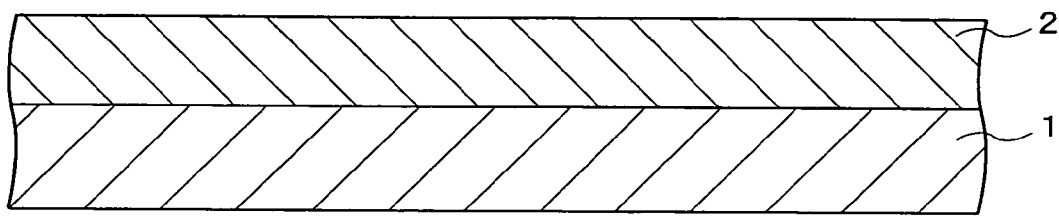
FIG. 35A
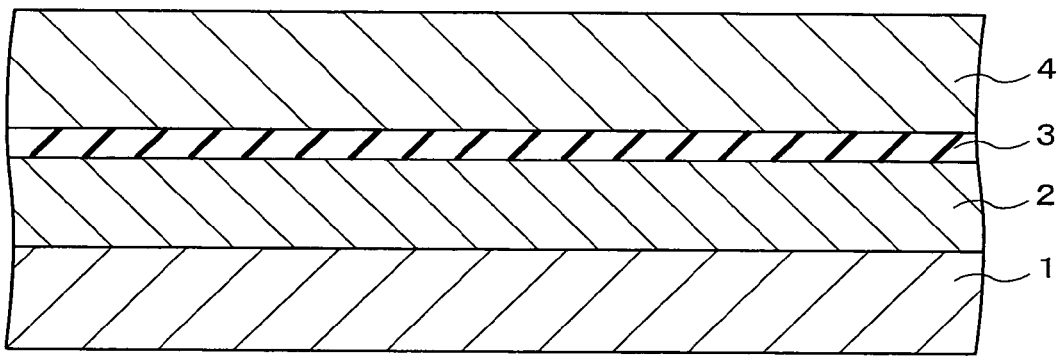
FIG. 35B
FIG. 35C
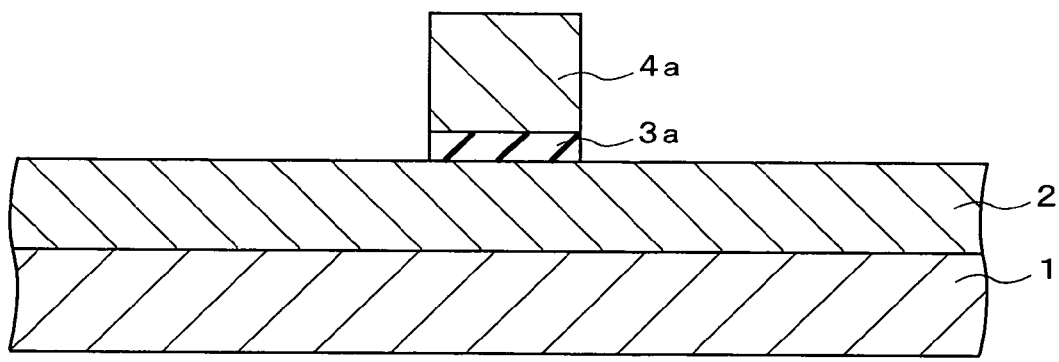

MIS-TYPE FIELD-EFFECT TRANSISTOR

TECHNICAL FIELD

The present invention relates to an MIS-type field-effect transistor, and particularly relates to an MIS-type field-effect transistor formed from a semiconductor having a strained channel.

BACKGROUND ART

MIS-type field-effect transistors (hereinafter abbreviated as MISFET) are commonly formed on group IV semiconductor substrates. The term "group IV semiconductor" refers to Ge, C, Si, and mixed crystals thereof. These group IV semiconductors are superior with regard to mechanical strength, cost, and micromachining properties compared to other semiconductors, and are adapted for creation of large-scale integrated circuits, which are the primary application of a MISFET.

Among group IV semiconductors, Si substrates in particular are most commonly used in MISFET fabrication. Some reasons for this are that $SiO_2$ gate insulating films are easily formed on an industrial scale, and that the $SiO_2$/Si interface characteristics are good.

However, Si suffers from low electron-hole mobility compared to other semiconductors. This is caused by silicon's characteristic band structure. Low mobility causes the channel resistance of a MISFET to increase, which leads to decreased switching speed in the MISFET. Techniques have therefore been proposed for changing the band structure while using Si as the channel material of a MISFET, and enhancing the electron-hole mobility (see Japanese Laid-open Patent Application Nos. 10-270685 and 2002-237590, for example). These methods involve straining the Si.

FIG. 17 shows a method for fabricating strained Si. First, a base substrate is prepared that is composed of $Si_{1-x}Ge_x$ (wherein $0<x\leq1$; hereinafter abbreviated as SiGe), which has a larger atomic spacing than Si. A thin film of Si is then epitaxially grown on this SiGe base substrate so as to create a matched lattice. The Si is then subjected to biaxial tensile strain, and the band structure is changed. The phonon dispersion and the effective mass of electrons and holes are thereby reduced, and the electron-hole mobility is increased in comparison to unstrained Si.

FIGS. 18A and 18B show the relationship between the rate of increase in electron-hole mobility and the Ge concentration (×100[%]) of the SiGe base substrate. In the diagrams, the solid and dashed curves indicate calculated values, and the plotted points indicate the experimental values. Since the atomic spacing of the $Si_{1-x}Ge_x$ crystals in the base substrate is substantially proportional to the Ge concentration, the amount of strain in the Si increases as the Ge concentration increases. It is apparent from these diagrams that the mobility of both electrons and holes can be increased by a factor of 1.5 or higher compared to unstrained silicon by applying a strain to the Si.

The method for manufacturing a strained-Si channel MISFET according to the conventional technique will next be described with reference to FIGS. 19A through 19C and FIGS. 20A and 20B. First, a strained Si layer 2 is epitaxially grown on a base SiGe layer 1 (FIG. 19A). A gate insulating film 3 and a gate electrode film 4 are then grown on this strained Si layer 2 (FIG. 19B), after which patterning is performed, and a gate insulating film 3a and gate electrode 4a are formed (FIG. 19C). Using the gate electrode 4a as a mask, an impurity is introduced by an ion implantation method into the regions in which the source and drain are to be formed inside the strained Si layer 2. The dose at this time is $1\times10^{15}$ cm$^{-2}$ or higher. This high-dose ion implantation is performed in order to sufficiently lower the contact resistance and the parasitic resistance between source and drain. An amorphous layer 5 is formed on the strained Si layer 2 by this type of high-dose ion implantation (FIG. 20A). Heat treatment is then performed in order to activate the impurity, whereupon the amorphous layer 5 crystallizes while undergoing solid-phase growth, and a source/drain region 6 is formed (FIG. 20B).

FIG. 21 shows the electrical characteristics of a strained-Si channel MISFET having a gate length of 1 μm created according to this method. This transistor has good electrical characteristics, and no abnormal leak currents or the like are observed.

Patent document 1: Japanese Unexamined Patent Publication hei-10-270685

Patent document 2: Japanese Unexamined Patent Publication 2002-237590

Non-Patent document 1: H. C.-H. Wang et al., "Substrate-Strained Silicon Technology: Process Integration", IEDM 2003, Technical Digest, pp. 61-64

Non-Patent document 2: Applied Physics, vol. 65, No. 11, p. 1131 1996, Ion Implantation Technology Proceedings vol. 2, p. 744 1999

DISCLOSURE OF THE INVENTION

The Problem to be Solved by the Invention

However, increased performance in a MISFET has been achieved by miniaturization according to scaling laws, and the implementation of a strained-Si channel MISFET having a short gate is therefore desired.

The inventors have discovered, however, that an abnormal off-leakage current occurs in a strained-Si channel MISFET when the gate length is reduced.

FIGS. 22A and 22B show the electrical characteristics (current between source and drain) of two types of strained-Si channel MISFET having a short gate. FIGS. 22A and 22B show measurements of a large number of each type of MISFET, all plotted on the same graph. FIG. 22A shows a case in which boron was ion-implanted at an energy of 2 keV and a dose of $3\times10^{15}$ cm$^{-2}$, and FIG. 22B shows a case in which arsenic was ion-implanted at an energy of 8 keV and a dose of $3\times10^{15}$ cm$^{-2}$ to form a source/drain region. It was only in the latter case that several MISFET were observed in which an abnormal off-leakage current flowed between the source and drain.

A MISFET that has this type of abnormal off-leakage current is unsuitable for use in creating a circuit because the power consumption of the circuit is likely to increase.

Abnormal leakage has also been discovered in the research results described in Non-patent document 1. This Non-patent document 1 claims that the cause of this abnormal leakage is a considerable long misfit dislocation extending in the <110> direction, and that the strained Si film thickness should be set so as to be equal to or less than the critical film thickness. However, as described hereinafter, it has been learned as a result of analysis by the inventors that abnormal leakage is not caused by this type of long misfit dislocation.

An object of the present invention is to provide a strained active semiconductor layer MISFET in which the abovementioned U-shaped dislocation is eliminated, the abnormal off-leakage current that occurs with a short gate is suppressed, and the power consumption is low even with a short gate.

Means for Solving the Problem

The MIS-type field-effect transistor according to the present invention is has a base layer, a strained active semiconductor layer formed on this base layer, a gate insulating film formed on the active semiconductor layer, a gate electrode formed on the gate insulating film, and source/drain region formed inside the active semiconductor layer on both sides of the gate electrode. The MIS-type field-effect transistor according to the present invention is characterized in that an interface between the base layer and the active semiconductor layer is at a depth of $2T_p$ or less from the surface, where $T_p$ is the depth of maximum concentration of an impurity introduced for forming the source/drain region.

The MIS-type field-effect transistor according to another aspect of the present invention is an MIS-type field-effect transistor having a base layer, a strained active semiconductor layer formed on this base layer, a gate insulating film formed on the active semiconductor layer, a gate electrode formed on this gate insulating film, a source/drain region formed inside the active semiconductor layer on both sides of the gate electrode, and a gate side wall formed on the lateral face of the gate electrode. The MIS-type field-effect transistor according to this aspect is characterized in that a portion under the gate side wall and the gate electrode on the active semiconductor layer has a greater film thickness than any other portion, and an interface between the base layer and the active semiconductor layer is at a depth of $2T_p$ or less from the surface of a region disposed other than under the gate side wall and the gate electrode of the active semiconductor layer, where $T_p$ is the depth of maximum concentration of an impurity introduced for forming the source/drain region.

The MIS-type field-effect transistor according to yet another aspect of the present invention has a base layer, a strained active semiconductor layer formed on this base layer, a gate insulating film formed on the active semiconductor layer, a gate electrode formed on this gate insulating layer, and a built-up layer provided with a source/drain region and formed on the active semiconductor layer on both sides of the gate electrode. The MIS-type field-effect transistor according to this aspect is characterized in that the built-up layer has a film thickness of $3T_p$ or greater and $5T_p$ or less, where $T_p$ is the depth of maximum concentration of an impurity introduced for forming the source/drain region.

The base layer is preferably composed of a semiconductor layer having the composition $Si_{1-x-y}Ge_xC_y$ (wherein $0 \leq x \leq 1$, $0 \leq y \leq 1$, and $0 < x+y \leq 1$), and the active semiconductor layer is preferably composed of an Si layer.

EFFECT OF THE INVENTION

Since the MISFET of the present invention is designed so that the film thickness of the strained active semiconductor layer is no more than twice the depth $T_p$ of maximum concentration of the impurity introduced for forming the source/drain region, or the film thickness of the built-up region formed on the strained active semiconductor layer is no less than three times the depth $T_p$, it is possible to prevent the formation of doping-induced dislocations in the strained active semiconductor layer. There is therefore no growth of U-shaped dislocations around these nuclei in the strained active semiconductor layer. As a result, a strained-channel MISFET can be obtained that has low power consumption, small channel length, and zero occurrence of abnormal off-leakage currents even when the gate in the MISFET is short.

BRIEF DESCRIPTION OF THE DRAWINGS

FIGS. 8A through 8C are sectional views showing the sequence of steps subsequent to the steps shown in FIG. 7 in the method for manufacturing a MISFET according to the third embodiment of the present invention;

FIGS. 32A through 32C are diagrams showing the mechanism whereby a dislocation loop formed in a strained layer grows into a U-shaped dislocation and reduces the strain;

FIG. 33 is a graph showing the dose dependency of the amorphous layer depth according to a Monte Carlo simulation when arsenic is ion-implanted into an Si (100) substrate;

FIGS. 34A and 34B are graphs showing the results of a Monte Carlo simulation of the impurity distribution immediately after ion implantation and after heat treatment when boron and arsenic are ion-implanted into an Si (100) substrate;

FIGS. 35A through 35C are sectional views showing the sequence of steps in the method for manufacturing a MISFET having a short gate according to the method for manufacturing a strained-Si channel MISFET having the conventional structure.

Figure 1A:
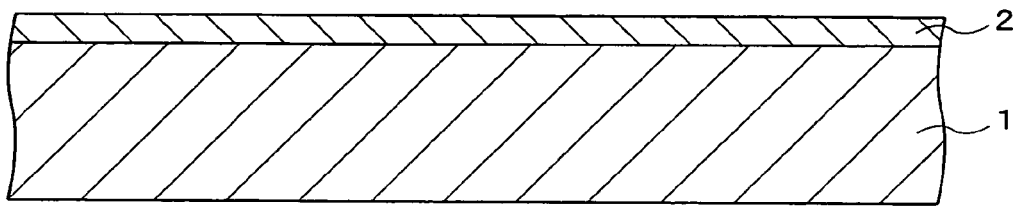
FIGS. 1A through 1C are sectional views showing the sequence of steps in the method for manufacturing a MISFET according to a first embodiment of the present invention.
Figure 1B:
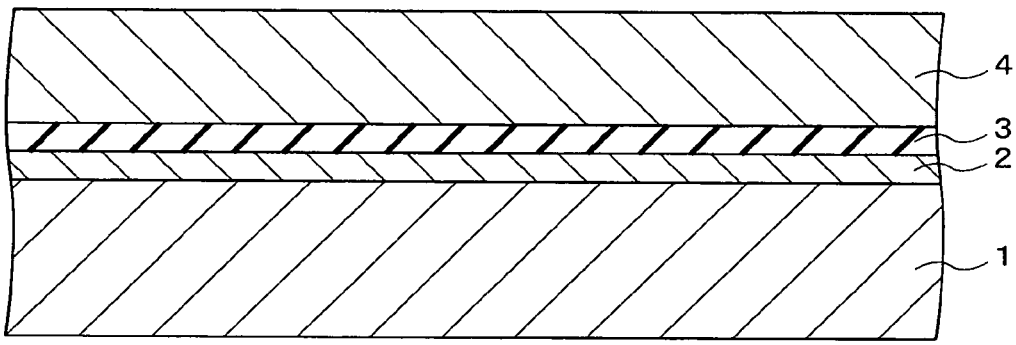

DESCRIPTION OF REFERENCE NUMERALS 1 base SiGe layer
2 strained Si layer
3 gate insulating film
3a gate insulating film
4 gate electrode film
4a gate electrode
5 amorphous layer
6 source/drain region
7 U-shaped dislocation
8 dislocation loop
9 impurity-implanted region
10 gate side wall
11 source/drain extension region
12 source/drain built-up region
13 base Si layer
14 strained $Si_{1-x-y}Ge_xC_y$ layer
15 cap Si layer
16 embedded oxide film

BEST MODE FOR CARRYING OUT THE INVENTION

As a result of various experiments, computations, and observations, the inventors arrived at the conclusion that a U-shaped dislocation grows from a dislocation that occurs due to ion implantation. The inventors first performed the various types of analysis described below in order to discover the cause of abnormal off-leakage currents.

Figure 23:
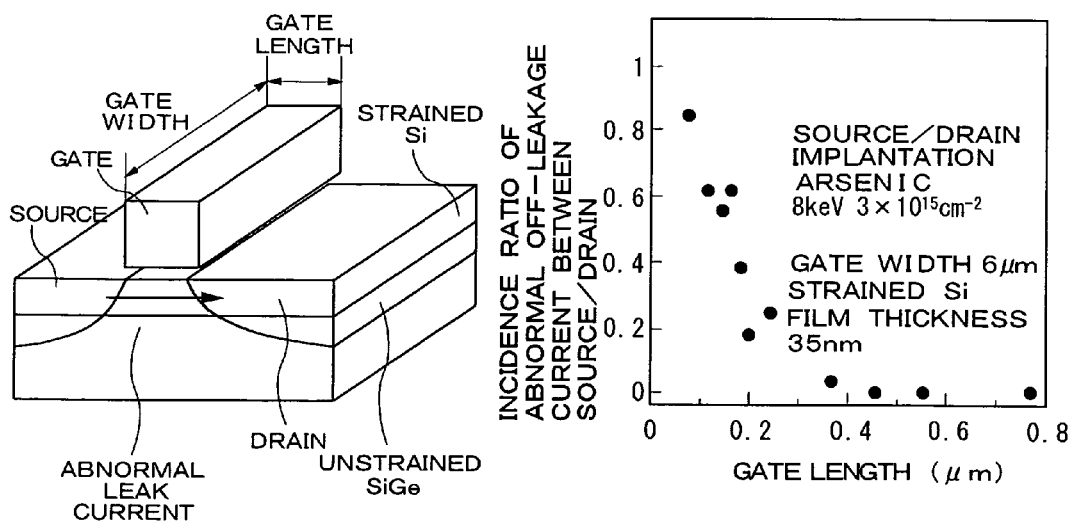
FIG. 23 is a graph showing the gate-length dependency of the incidence ratio of abnormal off-leakage currents in a strained-Si channel MISFET.

FIG. 23 shows the gate-length dependency of the incidence ratio (probability of incidence) of MISFET in which abnormal off-leakage currents flow when the source/drain is formed by ion implantation of arsenic. It was learned that an abnormal leak current occurs when the gate length is less than 0.4 μm. A possible explanation for this is the presence of a leak path of finite length in the strained Si layer or the base SiGe layer.

Figure 24:
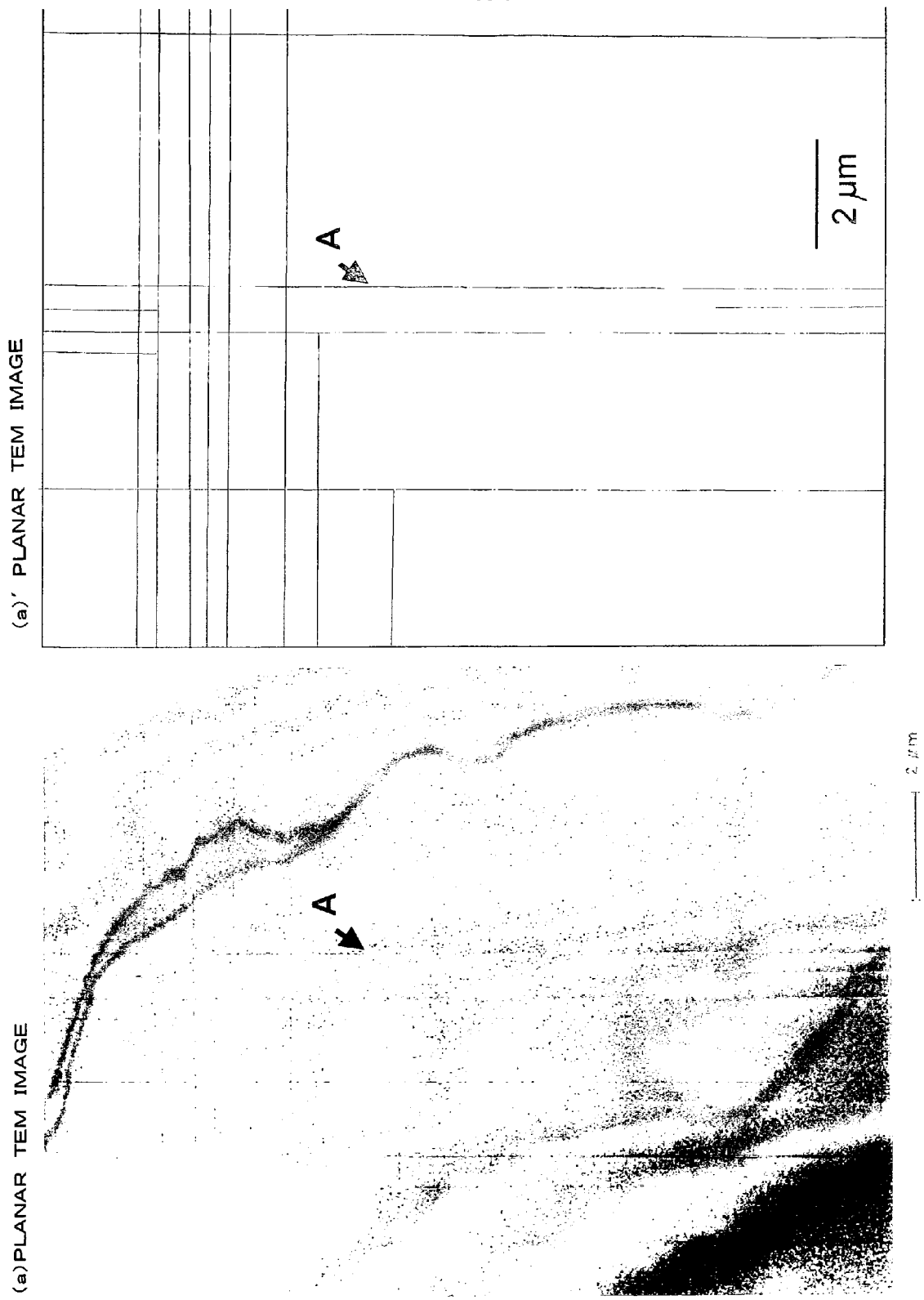
FIGS. 24(a) and 24(a)' are TEM images of the source/drain region formed in a strained-Si channel MISFET by ion-implantation of boron.
FIGS. 24(b) and 24(b)' are TEM images of the source/drain region formed in a strained-Si channel MISFET by ion-implantation of arsenic.

The source/drain region of the MISFET thus created was then observed by TEM (Transmission Electron Microscope). FIG. 24(a) shows the results of TEM observation of a source/drain region formed by ion implantation of boron, and FIG. 24(b) shows the results of TEM observation of a source/drain region formed by ion implantation of arsenic. FIGS. 24(a)' and 24(b)' are diagrams in which the linear patterns of FIGS. 24(a) and 24(b) are traced.

The results showed a pattern of long straight lines both in the case of boron implantation and in the case of arsenic implantation. This result is indicated by the reference symbol A in the diagrams. A pattern of short lines was observed only for the case of arsenic implantation. This result is indicated by the reference symbol B in the diagrams.

Figure 25:
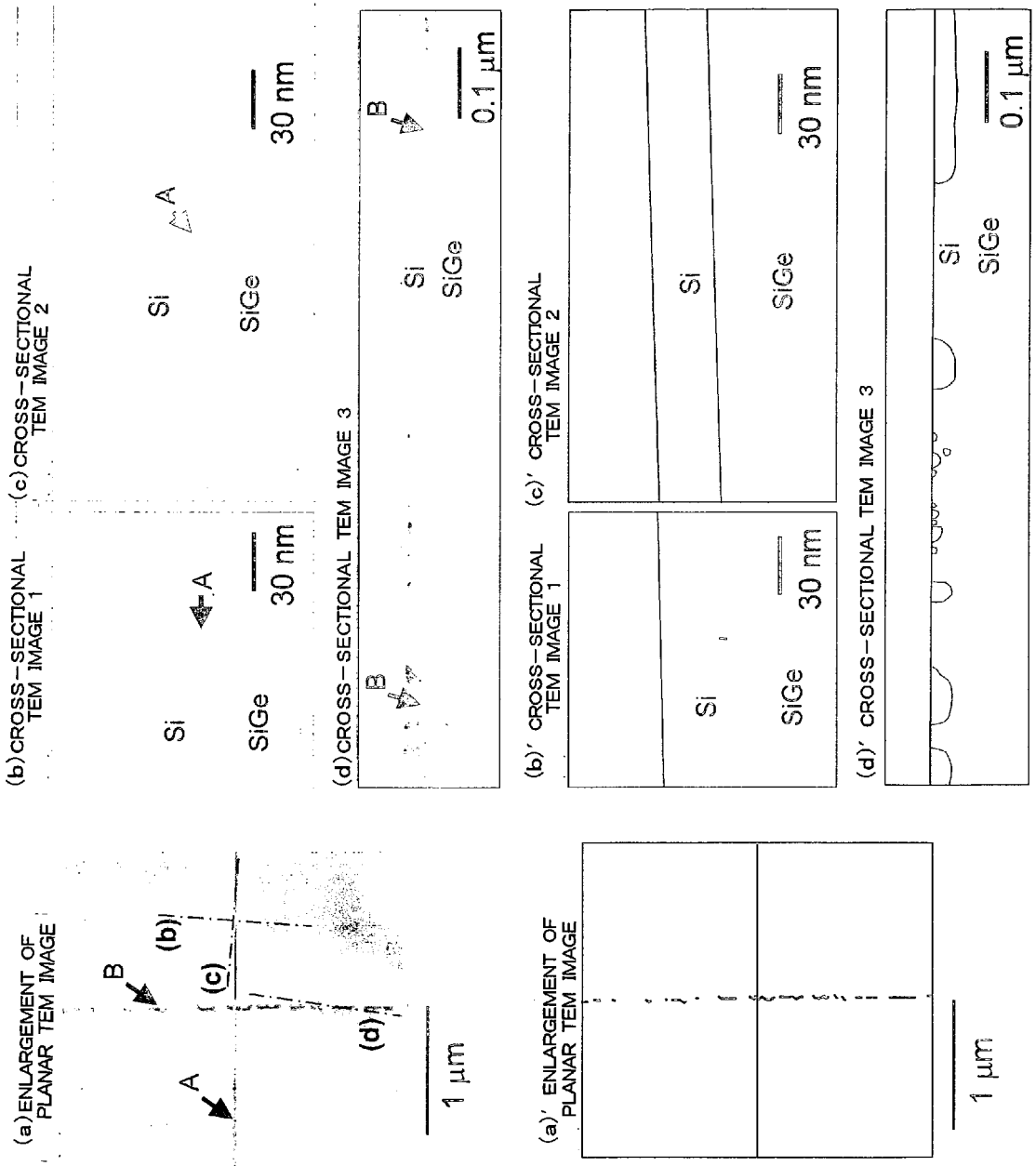
FIGS. 25(a) and 25(a)' are planar TEM images of the source/drain region formed in a strained-Si channel MISFET by ion-implantation of arsenic.
FIGS. 25(b), 25(b)', 25(c), 25(c)', 25(d), and 25(d)' are cross-sectional TEM images of the source/drain region formed in a strained-Si channel MISFET by ion-implantation of arsenic.

Cross-sectional TEM observation was then performed in order to investigate the causes of these patterns. The results thereof are shown in FIG. 25. FIG. 25(a) is a magnified view of the area inside the square frame in FIG. 24(b); and FIGS. 25(b), 25(c), and 25(d) are cross-sectional images of the portions corresponding to (b), (c), and (d) of FIG. 25(a). FIGS. 25(a)', 25(b)', 25(c)', and 25(d)' are diagrams in which the linear patterns of FIGS. 25(a), 25(b), 25(c), and 25(d) are traced.

First, it was learned that the pattern A on the long straight lines is a long misfit dislocation formed at the interface between the strained Si and the SiGe. However, this long misfit dislocation was not the cause of abnormal off-leakage. This is because an abnormal leak current was not observed in the case of boron ion implantation, and an abnormal leak current was also not observed when the gate was short, even in the case of arsenic ion implantation.

It was then learned that the short linear pattern B corresponded to a U-shaped dislocation of finite length such as one which has a misfit dislocated portion in the strained Si or at the interface between the strained Si and the SiGe, and in which both ends form penetrating dislocation portions in the surface of the strained Si. This dislocation is referred to hereinafter as a U-shaped dislocation. The inventors speculated that this U-shaped dislocation may be the cause of abnormal leakage.

Figure 26:
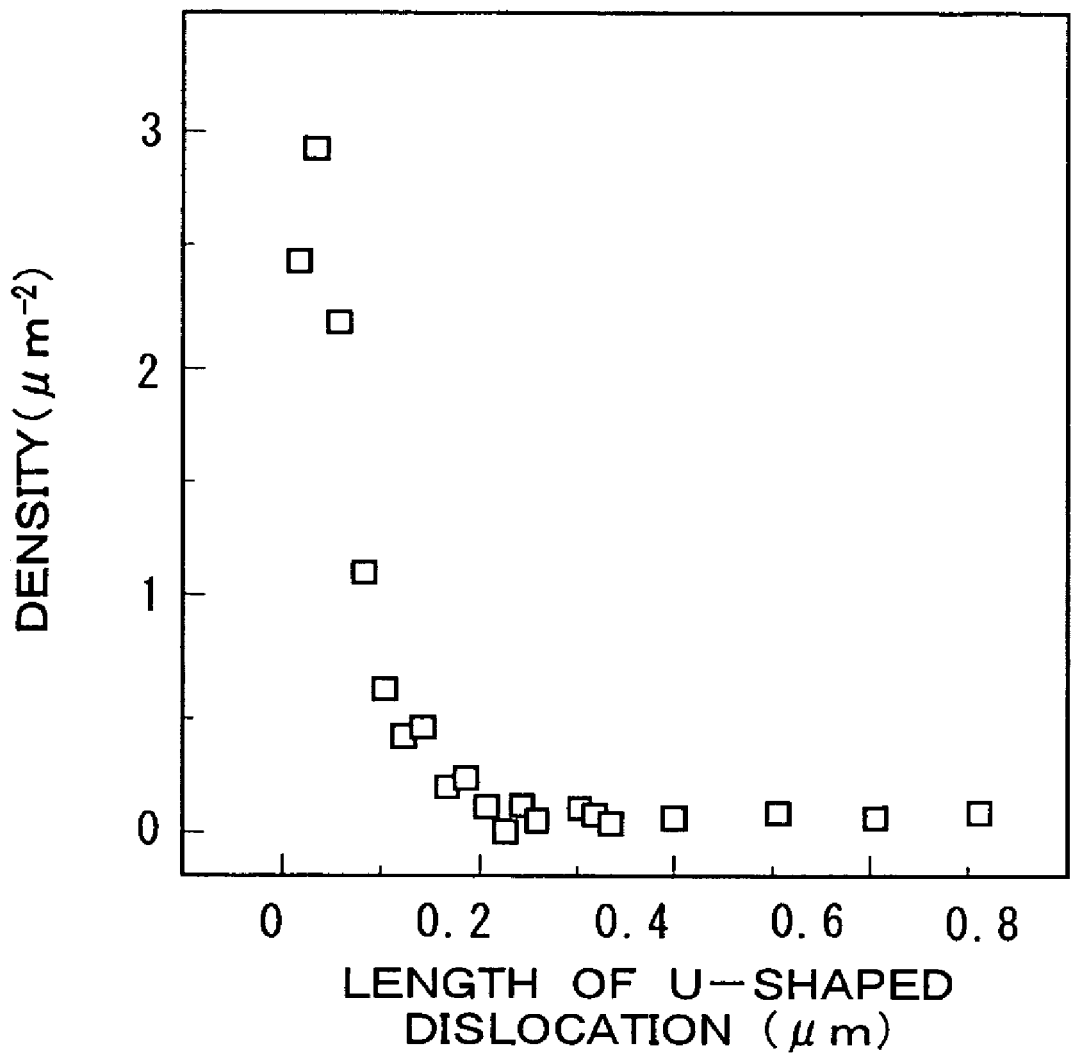
FIG. 26 is a graph showing the length distribution of U-shaped dislocations observed in the source/drain region formed in a strained-Si channel MISFET by ion-implantation of arsenic.

The relationship between the distribution density of U-shaped dislocations and the probability of abnormal leakage occurring in the MISFET was therefore investigated. FIG. 26 shows the relationship between the length and density of U-shaped dislocations found from the TEM image of the arsenic-implanted region. The maximum length of the U-shaped dislocations was about 0.3 μm to 0.4 μm. This length was substantially the same as the gate length at which MISFETs having an abnormal leak current begin to appear.

Figure 27A:
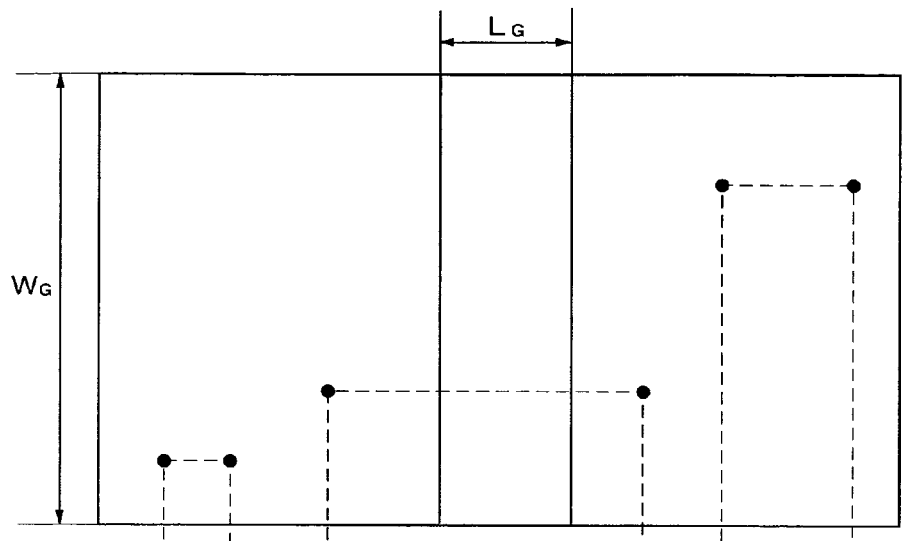
FIG. 27A is a schematic plan view showing the mechanism whereby U-shaped dislocations cause abnormal off-leakage current in the MISFET.
Figure 27B:
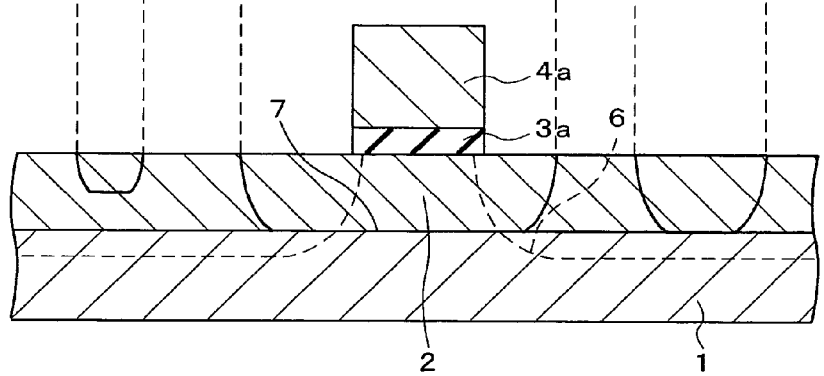
FIG. 27B is a schematic sectional view of the same.

The probability of an abnormal leak current occurring was then calculated from FIG. 26 under the assumption that abnormal off-leakage occurs when such a U-shaped dislocation spans the source/drain. FIG. 27 is a schematic view of a MISFET having a U-shaped dislocation. In this drawing, a U-shaped dislocation 7 indicated by length a2 spans the source/drain region 6, and an abnormal off-leakage current is assumed to occur.

Supposing that only a U-shaped dislocation of length a were distributed at an area density b, then the probability of this U-shaped dislocation not spanning the source/drain of a MISFET having gate length $L_G$ and gate width $W_G$ would be 1 when $L_G > a$, and $\exp\{-b \cdot W_G {}_X(a-L_G)\}$ when $L_G < a$.

When it is considered that U-shaped dislocations having various lengths ai are actually distributed at area densities bi, then the probability that no U-shaped dislocations will span the source/drain of a MISFET can be written as follows: $\Pi(L_G < ai) \exp\{-b_{i\ X} W_{G\ X}(ai-L_G)\}$. In this expression, $\Pi(L_G < ai)$ signifies calculating the product of the sequence $\exp\{-b_{i\ X} W_{G\ X}(ai-L_G)\}$ for all $L_G < ai$.

Therefore, more than one U-shaped dislocation spans the source/drain of the MISFET, and the probability of an abnormal off-leakage current occurring becomes $1 - \Pi(L_G < ai) \exp\{-b_{i\ X} W_{G\ X}(ai-L_G)\}$.

Figure 28:
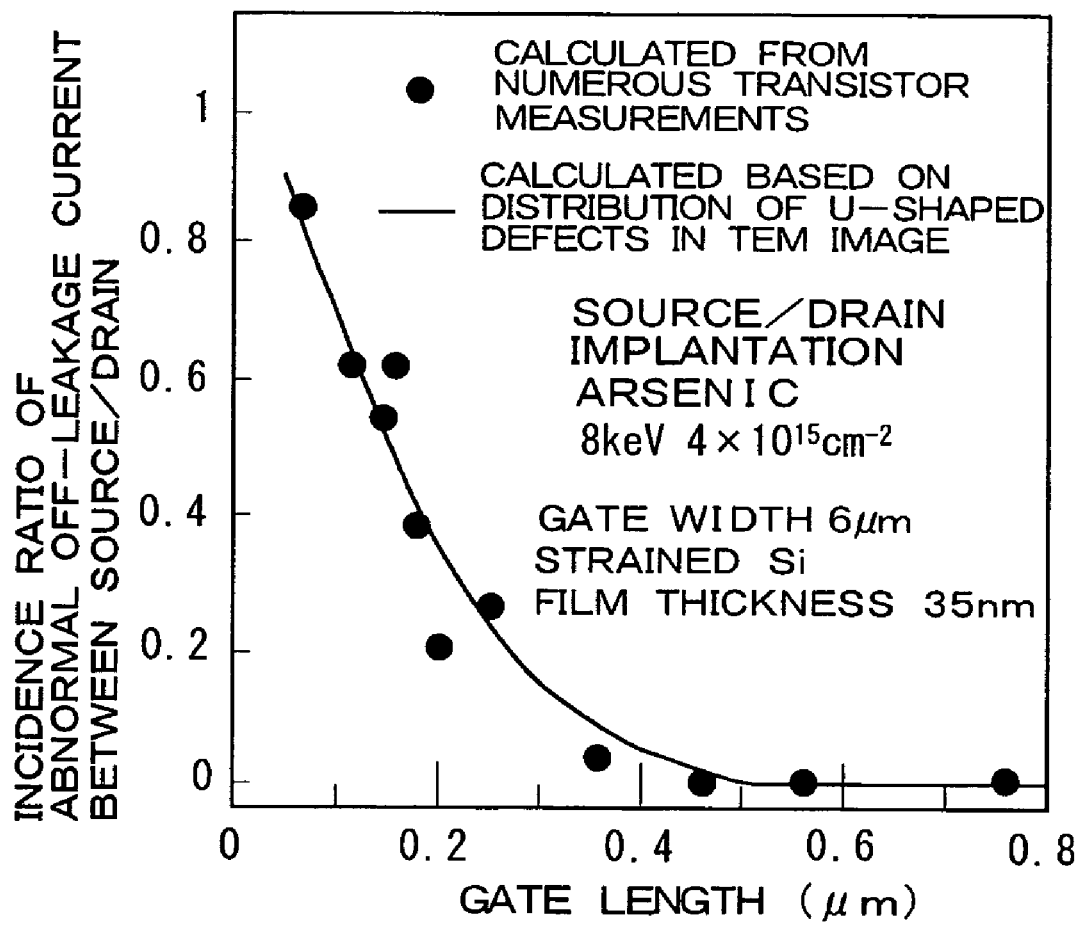
FIG. 28 is a graph comparing actual measured values to the predicted gate-length dependency of the incidence ratio of abnormal off-leakage currents calculated from the distribution of U-shaped dislocations.

The probability of abnormal leakage occurring, as calculated from FIG. 26 according to this computational expression, is indicated by the solid line in FIG. 28. FIG. 28 shows the relationship between the gate length and the incidence ratio of abnormal off-leakage between the source and drain, wherein the gate length is plotted on the horizontal axis, and the incidence ratio is plotted on the vertical axis. The data for the MISFET in FIG. 23 is also shown in FIG. 28. These data are well correlated, and it can be concluded that U-shaped dislocations are the cause of abnormal leakage currents. The present invention was developed on the basis of such findings.

Figure 29A:
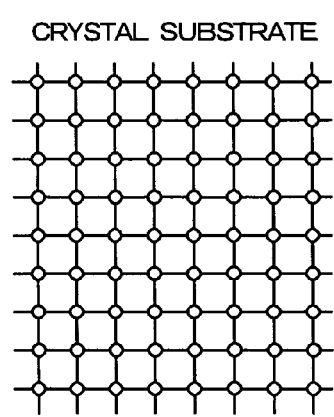
FIGS. 29A through 29D are diagrams showing the mechanism whereby dislocation loops occur when an impurity is ion-implanted into a crystal substrate and heat treatment is performed.
Figure 29B:
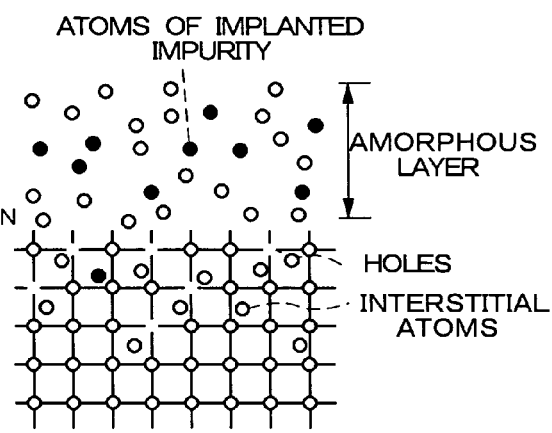
Figure 29C:
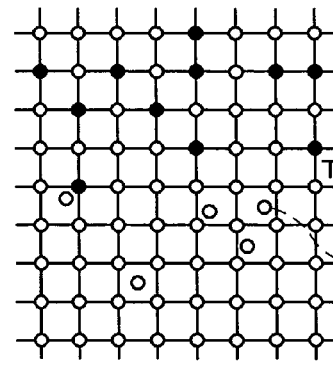
Figure 29D:
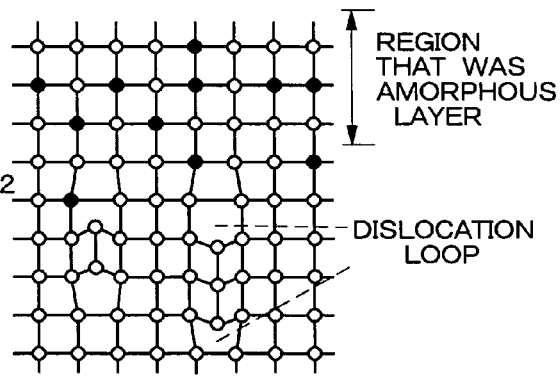
Figure 30A:
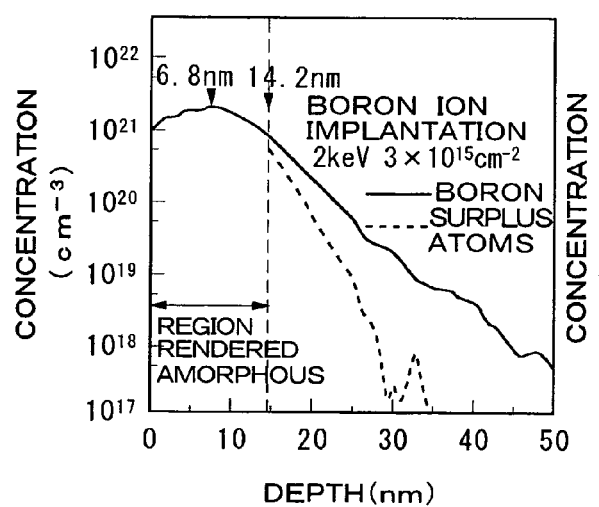
FIGS. 30A and 30B are graphs showing the results of a Monte Carlo simulation of the amorphous layer depth and the distribution of impurities/surplus atoms when boron and arsenic are ion-implanted into a Si (100) substrate.
Figure 30B:
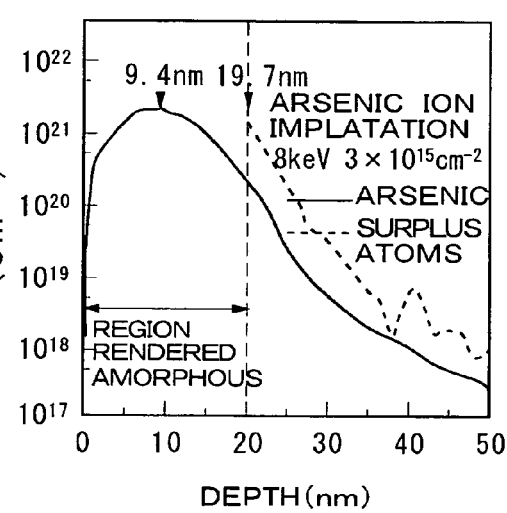

The ion-implantation of an impurity into the substrate will next be described. FIGS. 29A through 29D show the behavior of atoms caused by ion implantation of an impurity into the substrate and subsequent heat treatment. When ions are implanted at a high concentration in a crystal substrate, the surface is rendered amorphous as shown in FIG. 29B, and holes and interstitial atoms are formed in the crystal region directly below the boundary of the amorphous layer. At this time, the interstitial atoms also include atoms that are forced out from the amorphous layer, and the number of interstitial atoms is therefore higher than the number of holes. These extra interstitial atoms are referred to herein as surplus atoms. When the substrate is heat-treated, a portion of the interstitial atoms settle into nearby holes, but the surplus atoms remain as such in the lattice. The amorphous layer grows by a solid-phase growth while affected by the base crystal layer, and the entire layer crystallizes, as shown in FIG. 29C. As examples, FIGS. 30A and 30B use dashed lines to show the results of a Monte Carlo simulation of the distribution of surplus atoms immediately after boron or arsenic is ion-implanted into an Si (100) crystal substrate. Surplus atoms are more numerous in the case of arsenic ion implantation than in the case of boron ion implantation. The reason for this is that when the implanted quantities are the same, arsenic atoms are heavier than boron atoms and force out more silicon atoms. These surplus atoms generated by ion implantation gradually precipitate over the course of heat treatment and form small dislocation loops, as shown in FIG. 29D.

Figure 31:
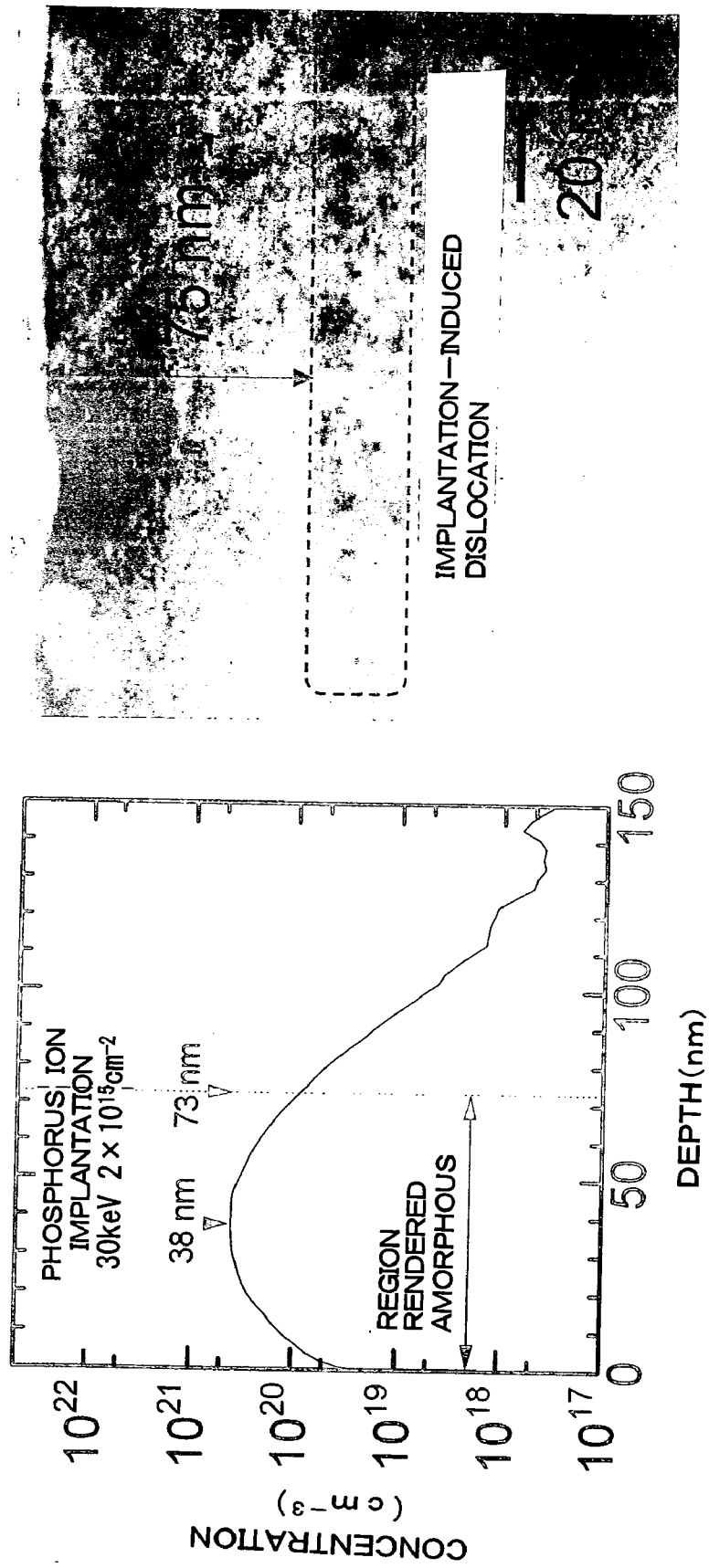
FIG. 31 is a diagram showing the results of a Monte Carlo simulation of the amorphous layer depth and phosphorus concentration distribution when phosphorus is ion-implanted into an Si (100) substrate, and shows a cross-sectional TEM image taken after heat treatment.

FIG. 31 shows a cross-sectional TEM image of a dislocation loop formed by ion implantation. Phosphorus was ion-implanted into an Si (100) crystal under conditions of 30 keV and $2 \times 10^{15}$ cm$^{-2}$, and heat treatment was performed at 790° C. for 10 seconds. As a result of the Monte Carlo simulation, the depth of the amorphous region immediately after ion implantation was calculated to be 73 nm. It was actually confirmed in the cross-sectional TEM image that a dislocation had formed directly below this depth. Experimental results like these are also reported in another publication (Applied Physics, Vol. 65, No. 11, p. 1131, 1996; *Ion Implantation Technology Proceedings* Vol. 2, p. 744, 1999).

Formed by ion implantation, this type of small dislocation loop causes strain to occur in the periphery of an unstrained film. Therefore, when heat treatment is continued further in order to diminish the strain, the strain gradually decreases while the interstitial atoms are re-released. The re-released interstitial atoms diffuse towards the substrate surface, and thus form a portion of a new crystal surface. It is believed, however, that when dislocation loops are formed in a strained layer, larger dislocation loops may be formed by heat treatment. This is because the strain of a strained film can be reduced by enlarging the dislocations.

This process will be described using FIGS. 32A through 32C. FIG. 32B shows small dislocation loops formed in a strained film by ion implantation and subsequent heat treatment. The strain is alleviated around the dislocation loops. Therefore, if heat treatment is performed, then atoms are repositioned so as to enlarge the dislocation loops. The dislocation loops finally reach the surface and become U-shaped dislocations, as shown in FIG. 32C.

It is also appropriate to assume that U-shaped dislocations originate from dislocation loops created by ion implantation, since U-shaped dislocations were observed only in the case of arsenic ion implantation, in which there are more surplus atoms that give rise to dislocation loops.

The inventors therefore concluded that U-shaped dislocations grow from dislocation loops formed due to ion implantation. It is therefore critical that dislocations from ion implantation not be formed in the strained layer. The structure for preventing dislocation loops from forming in the strained layer will next be described.

FIG. 33 is a graph showing the relationship between the dose of arsenic and the depth of the interface between the amorphous layer and the crystal layer in an Si (100) crystal substrate normalized according to the depth (Rp) of maximum impurity concentration immediately after implantation. The graph shows the results calculated by a Monte Carlo simulation. It was learned that for the dose of $1 \times 10^{15}$ cm$^{-2}$ necessary for forming the source/drain, the depth of the amorphous layer/crystal layer interface is 2Rp or greater and 2.5Rp or less. Dislocations formed by ion implantation appeared at a greater depth than the interface between the amorphous layer and the crystal layer. Therefore, when the strained layer is given a thickness of less than 2Rp, implantation-induced dislocations are not formed in the strained-Si layer, and U-shaped dislocations do not occur.

FIGS. 34A and 34B show the concentration distribution of the impurity after heat treatment. The depth of maximum impurity concentration immediately after ion implantation is the same as the depth of maximum impurity concentration after heat treatment. The reason for this is that the diffusion rate of the impurity decreases and approaches the original concentration distribution as the concentration of the impurity increases. Specifically, $T_p = R_p$, where $T_p$ is the depth of maximum impurity concentration in the source/drain. Consequently, when the film thickness of the strained layer is set to $2T_p$ or less as in the present invention (wherein $T_p$ is the depth of maximum impurity concentration in the source/drain), a dislocation due to ion implantation is not formed in the strained layer. There is therefore no growth of U-shaped dislocations around these nuclei in the strained layer, and hence no abnormal off-leakage currents in a MISFET that has a short gate.

The problems that occur when a strained-Si channel MISFET having a short gate is manufactured according to the conventional manufacturing method will be described in further detail using FIGS. 35A through 35C, and FIGS. 36A through 36C.

Figure 36A:
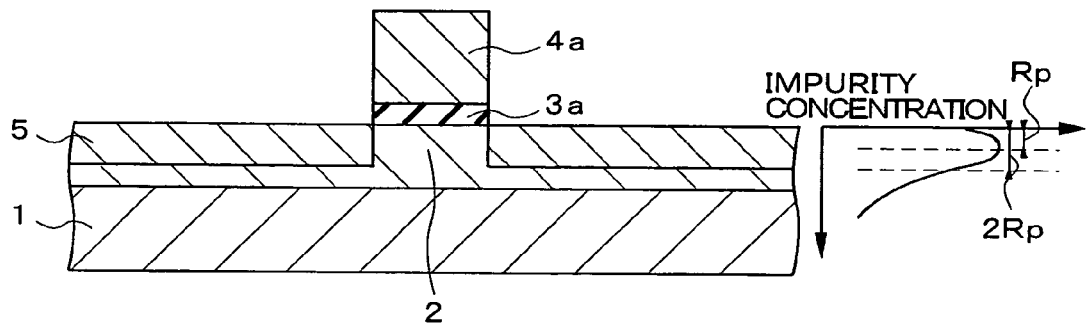
FIGS. 36A through 36C are sectional views showing the sequence of steps subsequent to the steps shown in FIG. 35 in the method for manufacturing a MISFET having a short gate according to the method for manufacturing a strained-Si channel MISFET having the conventional structure.

First, a strained Si layer 2 is epitaxially grown on a base SiGe layer 1 (FIG. 35A). A gate insulating film 3 and a gate electrode film 4 are then grown thereon (FIG. 35B), after which patterning is performed, and a gate insulating film 3a and a gate electrode 4a having a length of 0.4 μm or less are formed (FIG. 35C). An impurity is then ion-implanted at a dose of $1 \times 10^{15}$ cm$^{-2}$ or higher using the gate electrode 4a as a mask. The impurity is thus introduced into the source/drain region, and an amorphous layer 5 is formed (FIG. 36A). The depth thereof is $2R_p$ or greater, where $R_p$ is the depth at which the impurity concentration is at maximum.

Figure 36B:
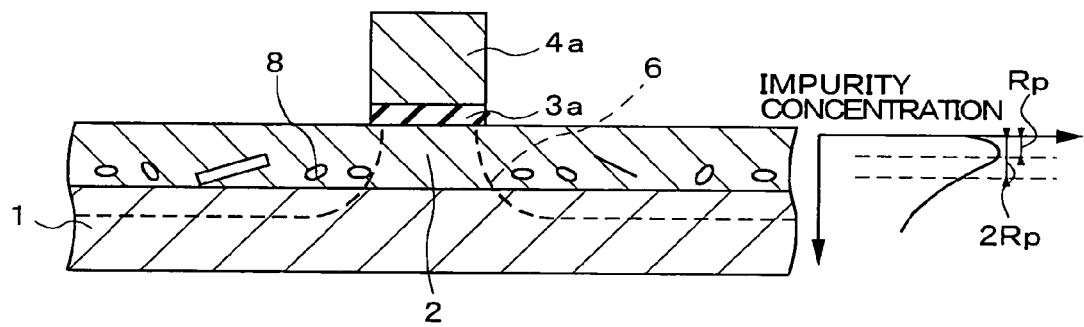
Figure 36C:
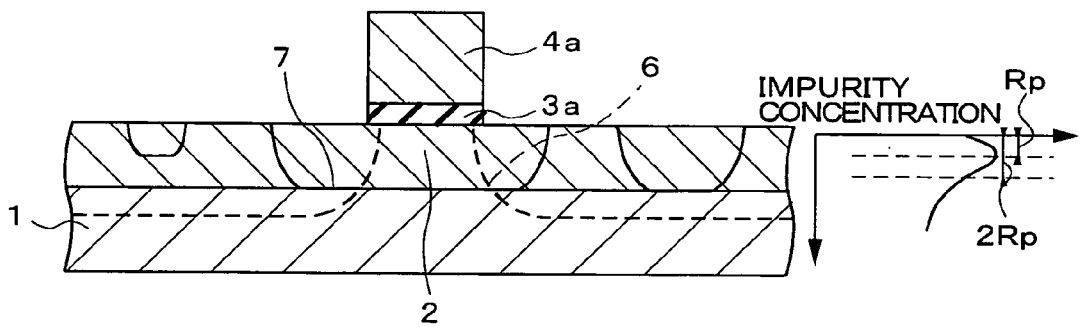

Heat treatment is then performed in order to activate the impurity. A source/drain region 6 is thus formed. The amorphous layer 5 crystallizes, and dislocation loops 8 are formed directly underneath (FIG. 36B). When further heat treatment is performed to adequately activate the impurity, the dislocation loops 8 therefore grow considerably and become U-shaped dislocations 7 (FIG. 36C) in order to reduce the strain of the strained Si layer 2. The lengths of the U-shaped dislocations 7 reach a maximum of about 0.4 μm. A MISFET having a gate length of 0.4 μm or less therefore becomes stochastically prone to abnormal off-leakage currents.

Therefore, in the embodiments of the present invention described hereinafter, measures are taken to prevent dislocation loops 8 usually brought about by ion implantation from forming in the strained Si layer 2, where these dislocation loops act as nuclei for the formation of U-shaped dislocations.

Strained Si was used as an example of a strained group IV semiconductor, but $Si_{1-x-y}Ge_xC_y$ (wherein $0 \leq x \leq 1$, $0 \leq y \leq 1$, and $0 < x+y \leq 1$) is also sometimes used as the strained semiconductor. In this case, it is also effective to place a cap Si layer having a thickness of 10 nm or less between the $Si_{1-x-y}Ge_xC_y$ and the gate insulating film in order to form a high-quality gate insulating film. This Si layer is given a thickness of 10 nm or less in order to prevent a condition in which all of the channels are localized only in the cap Si layer. In this instance, the depth from the surface to the interface between the strained $Si_{1-x-y}Ge_xC_y$ layer and the base layer is set to $2T_p$ or less.

Dislocations are also effectively prevented from occurring in the strained film by giving the source/drain a built-up structure, and localizing dislocations due to ion implantation in this built-up portion. In this case, as is also apparent from FIG. 31, dislocations due to ion implantation do not occur at a depth at which $3R_p = 3T_p$ or greater, and the thickness of the built-up film may therefore be set to $3T_p$ or greater.

The impurity cannot be adequately doped into the entire built-up portion if the built-up film is too thick, and the built-up film must therefore be given a thickness of $5T_p$ or less. As is apparent from FIG. 34, this film thickness enables doping of at least $1 \times 10^{18}$ cm$^{-3}$ or higher, and makes it possible to maintain the ohmic properties of the source/drain resistance.

Dislocations also do not occur in the strained-Si layer when low-damage, high-dose doping can be performed on the source/drain layer. Such methods include plasma doping and gas-phase doping. In these methods, the impurity diffuses in after being adsorbed in the gas-phase on the surface of the strained film, making it possible to perform high-dose doping without destroying the crystal layer.

Specifically, dislocations due to doping do not form in the strained layer when these methods are used. These dislocations are therefore unavailable as nuclei for the growth of U-shaped dislocations in the strained layer, and a strained-Si channel MISFET can therefore be obtained that has low power consumption and no occurrence of abnormal off-leakage currents even when the gate in the MISFET is short.

Embodiments of the present invention will be described in detail hereinafter with reference to the accompanying drawings.

First Embodiment

Figure 1C:
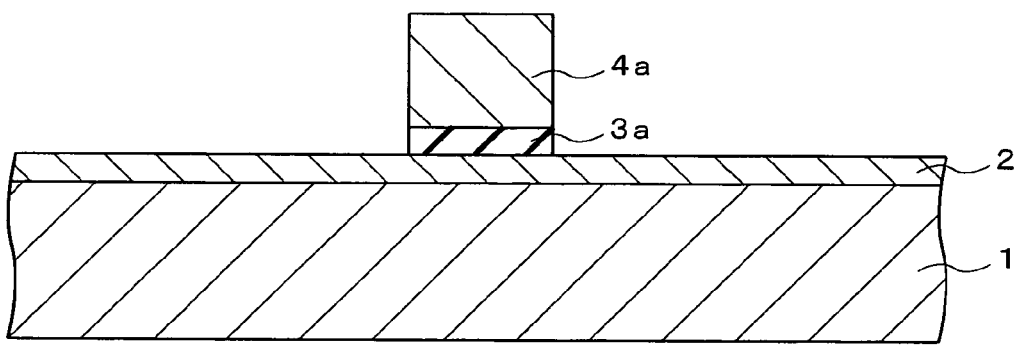
Figure 2A:
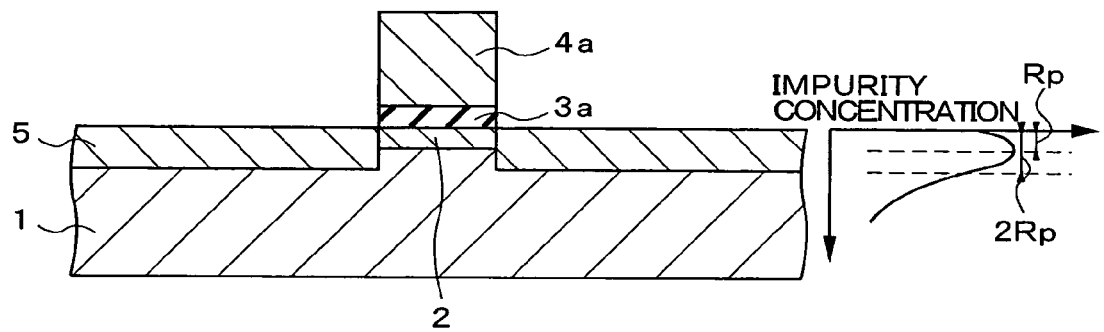
FIGS. 2A through 2C are sectional views showing the sequence of steps subsequent to the steps shown in FIG. 1 in the method for manufacturing a MISFET according to the first embodiment of the present invention.

FIGS. 1A through 1C and FIGS. 2A through 2C are sectional views showing the sequence of steps in the method for manufacturing a MISFET according to a first embodiment of the present invention. First, a strained Si layer 2 is epitaxially grown on the base SiGe layer 1 (FIG. 1A). The film thickness of this strained Si layer 2 is set to $2T_p$ or less, where $T_p$ is the depth at which the impurity concentration of the source/drain of the final MISFET is at maximum. A gate insulating film 3 and a gate electrode film 4 are then grown thereon (FIG. 1B), after which patterning is performed, and a gate insulating film 3a and a gate electrode 4a having a length of 0.4 μm or less are formed (FIG. 1C). An impurity in the amount of $1 \times 10^{15}$ cm$^{-2}$ or higher is then ion-implanted into the strained Si layer 2 and the base SiGe layer 1 using the gate electrode 4a as a mask. An impurity is thus introduced at high concentration into the region in which the source/drain is to be formed, and an amorphous layer 5 is formed in this region. The depth of this amorphous layer 5 is $2R_p$, where $R_p$ is the depth at which the concentration of the impurity is at maximum (FIG. 2A).

Figure 2B:
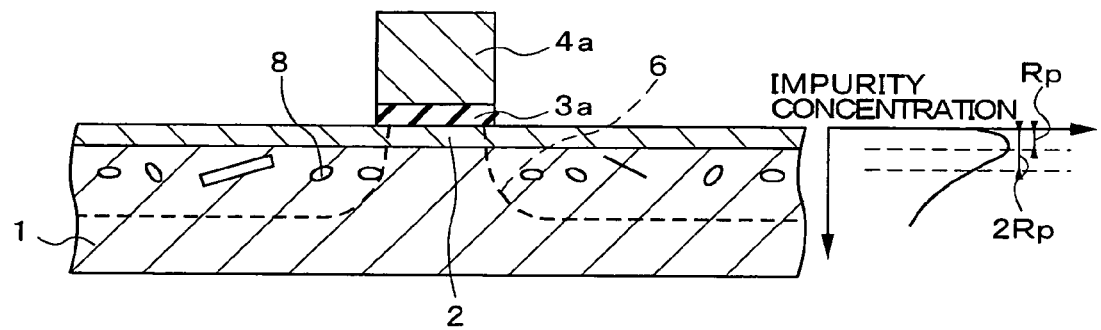
Figure 2C:
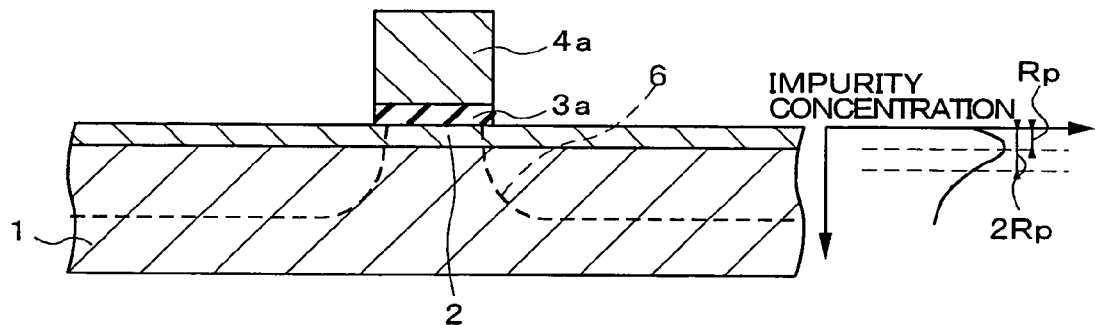

Heat treatment is then performed in order to activate the impurity. A source/drain region 6 is thus formed. The amorphous layer 5 also crystallizes, and dislocation loops 8 are formed directly underneath. However, the dislocation loops 8 are not formed in the strained Si layer 2, and all the loops are formed in the unstrained base SiGe layer 1 (FIG. 2B). Further heat treatment is performed in order to adequately activate the impurity. However, since the dislocation loops 8 are formed in the unstrained base SiGe layer 1, the dislocation loops 8 are removed or reduced in size by this heat treatment, and U-shaped dislocations are not formed (FIG. 2C). Abnormal off-leakage currents therefore do not occur in the completed MISFET.

Second Embodiment

Figure 3A:
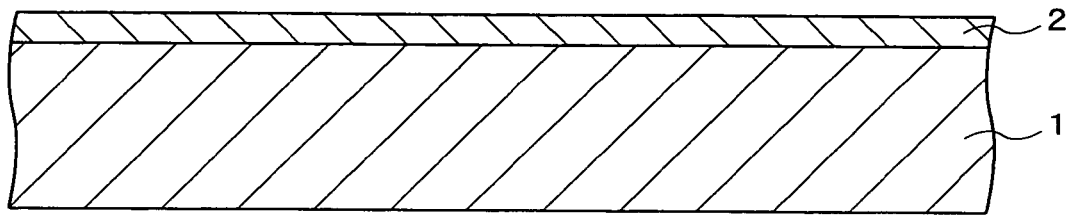
FIGS. 3A through 3C are sectional views showing the sequence of steps in the method for manufacturing a MISFET according to a second embodiment of the present invention.
Figure 3B:
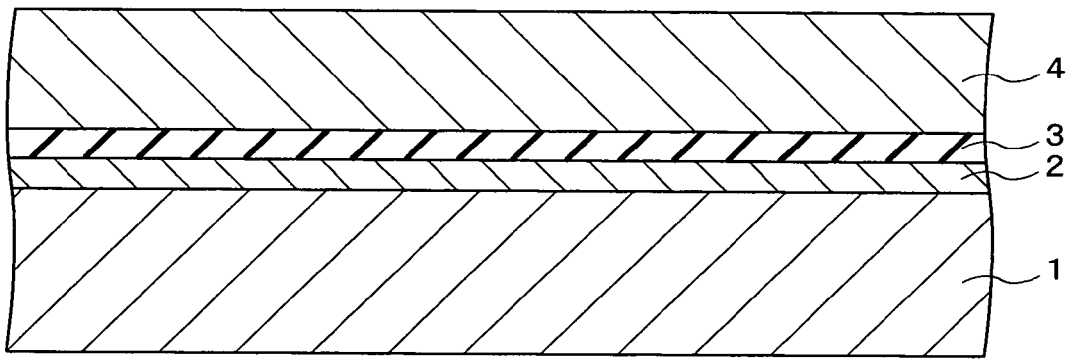
Figure 3C:
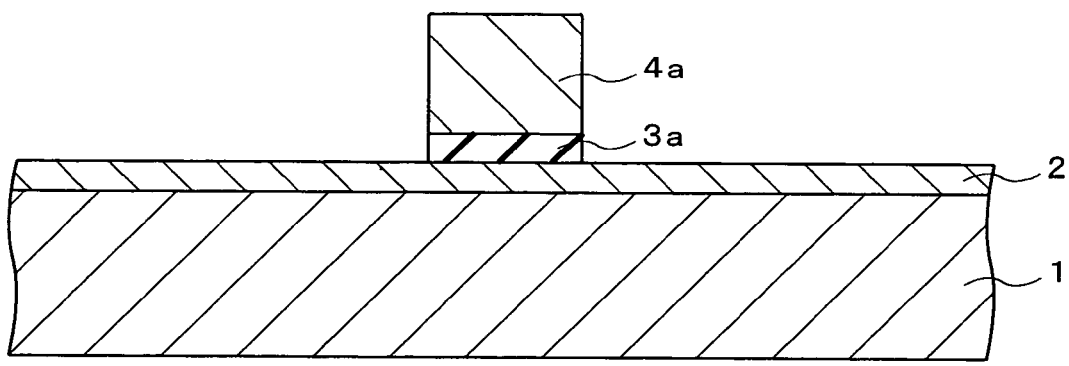

FIGS. 3A through 3C, FIGS. 4A through 4C, and FIGS. 5A and 5B are sectional views showing the sequence of steps in the method for manufacturing a MISFET according to a second embodiment of the present invention. First, a strained Si layer 2 is epitaxially grown on the base SiGe layer 1. The film thickness of this strained Si layer 2 is set to $2T_p$ or less, where $T_p$ is the depth at which the impurity concentration of the source/drain of the final MISFET is at maximum (FIG. 3A). A gate insulating film 3 and a gate electrode film 4 are then grown thereon (FIG. 3B), after which patterning is performed, and a gate insulating film 3a and a gate electrode 4a having a length of 0.4 μm or less are formed (FIG. 3C).

Figure 4A:
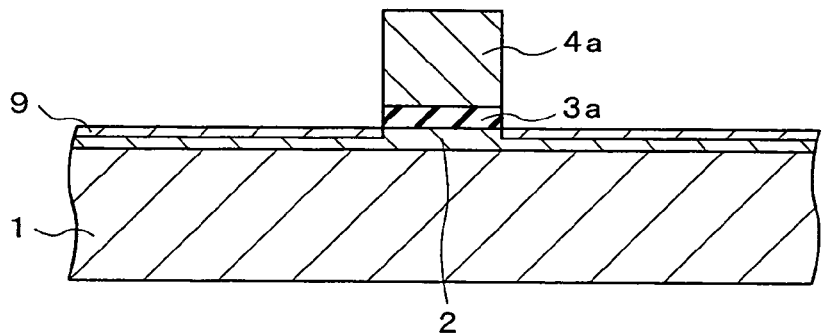
FIGS. 4A through 4C are sectional views showing the sequence of steps subsequent to the steps shown in FIG. 3 in the method for manufacturing a MISFET according to the second embodiment of the present invention.
Figure 4B:
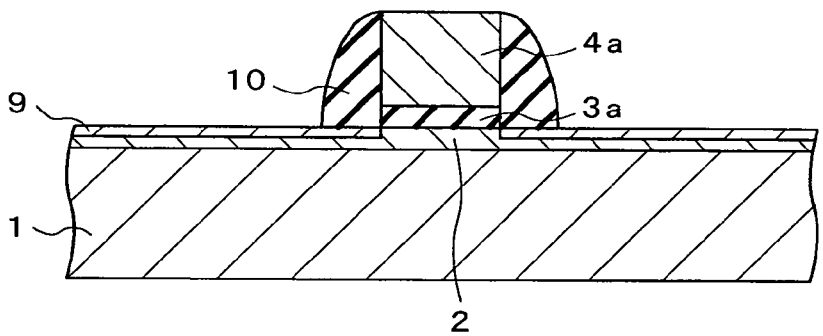
Figure 4C:
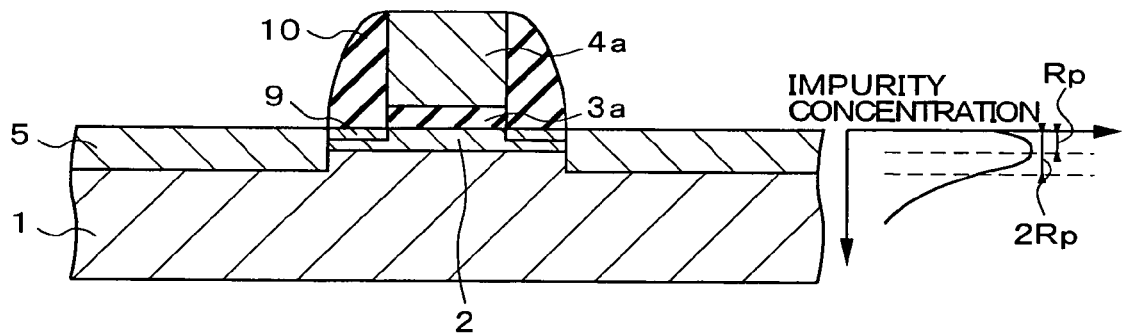

An impurity for forming a source/drain extension region is then ion-implanted into the strained Si layer 2 using the gate electrode 4a as a mask, and an impurity-implanted region 9 is formed (FIG. 4A). In this instance, the implantation energy and dose are reduced compared to that of the ion implantation for forming the source/drain. This is done in order to form a shallower, steeper joint. A gate sidewall 10 is then formed by oxide film growth and back-etching (FIG. 4B). An impurity in an amount of $1 \times 10^{15}$ cm$^{-2}$ or higher is then ion-implanted using the gate electrode 4a and the gate sidewall 10 as masks. An impurity is thus introduced at high concentration into the region in which the source/drain is to be formed, and an amorphous layer 5 is formed. The depth of this amorphous layer 5 is $2R_p$ or greater, where $R_p$ is the depth at which the concentration of the impurity is at maximum (FIG. 4C).

Figure 5A:
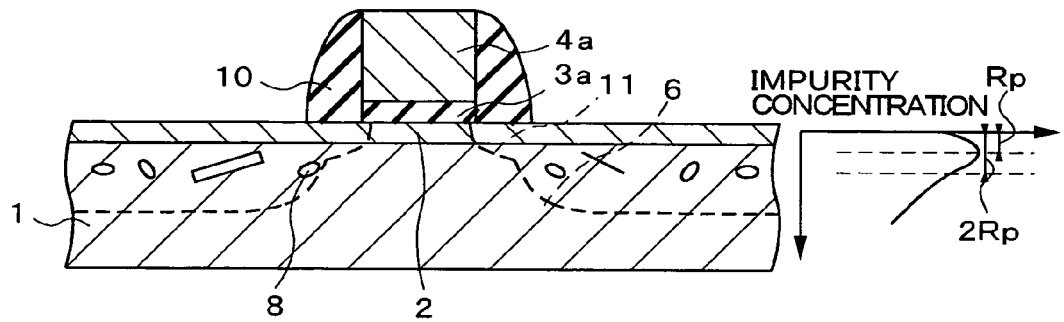
FIGS. 5A and 5B are sectional views showing the sequence of steps subsequent to the steps shown in FIG. 4 in the method for manufacturing a MISFET according to the second embodiment of the present invention.
Figure 5B:
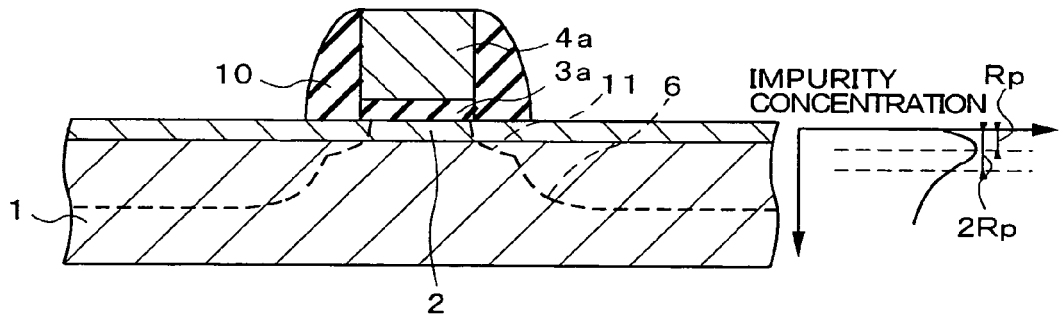

Heat treatment is then performed in order to activate the impurity. A source/drain region 6 and a source/drain extension region 11 are thus formed. The amorphous layer 5 also crystallizes, and dislocation loops 8 are formed directly underneath (FIG. 5A). However, the dislocation loops 8 are not formed in the strained Si layer 2, and all the loops are formed in the unstrained base SiGe layer 1. In this instance, dislocation loops are not formed directly under the impurity-implanted region 9. This is because the energy and dose are low in the ion implantation for forming the source/drain extension region, and there are insufficient surplus atoms for forming dislocation loops. Further heat treatment is performed in order to adequately activate the impurity. However, since the dislocation loops 8 are formed in the unstrained base SiGe layer 1, the dislocation loops 8 are removed or reduced in size, and U-shaped dislocations are not formed (FIG. 5B). Abnormal off-leakage currents therefore do not occur in the completed MISFET.

Figure 6:
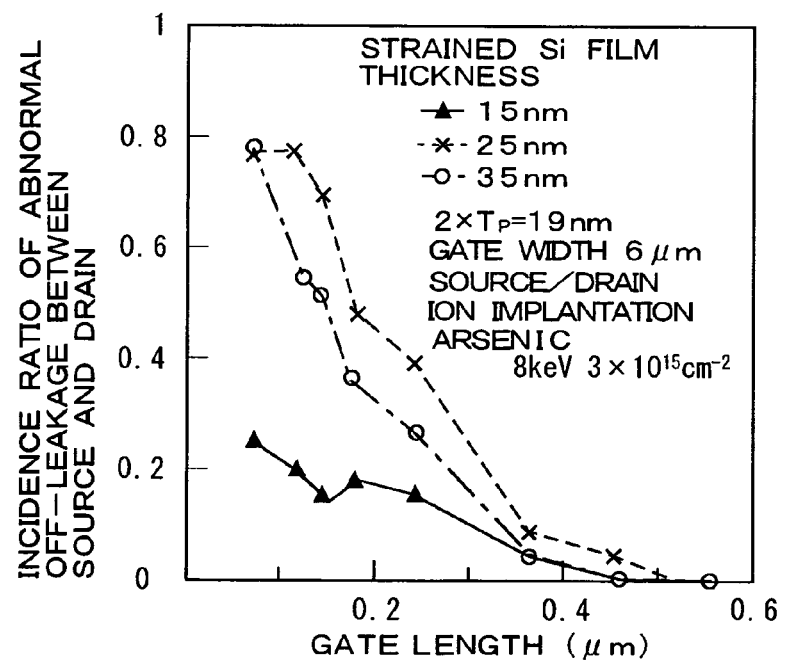
FIG. 6 is a graph showing the gate-length dependency of the incidence ratio of abnormal off-leakage currents in an actual MISFET manufactured according to the second embodiment of the present invention.

FIG. 6 shows the gate-length dependency of the incidence ratio of abnormal off-leakage currents in a MISFET manufactured according to the second embodiment. Ion implantation was performed using a dose of $3 \times 10^{15}$ cm$^{-2}$ to form the source/drain region, and $2T_p = 19$ nm. Abnormal off-leakage currents occurred at about the same high rate when the film thickness of the strained-Si layer was 25 nm and 35 nm, which were thicker than $2T_p$. It was also learned that abnormal off-leakage currents were significantly reduced when the film thickness of the strained-Si layer was 15 nm, which is less than $2T_p$. Variation of the film thickness of the strained-Si layer in the plane of the substrate is believed to be the reason that abnormal off-leakage currents were not completely eliminated.

Third Embodiment

Figure 7A:
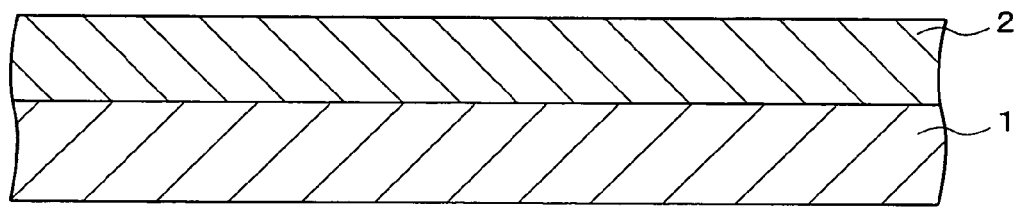
FIGS. 7A through 7C are sectional views showing the sequence of steps in the method for manufacturing a MISFET according to a third embodiment of the present invention.
Figure 7B:
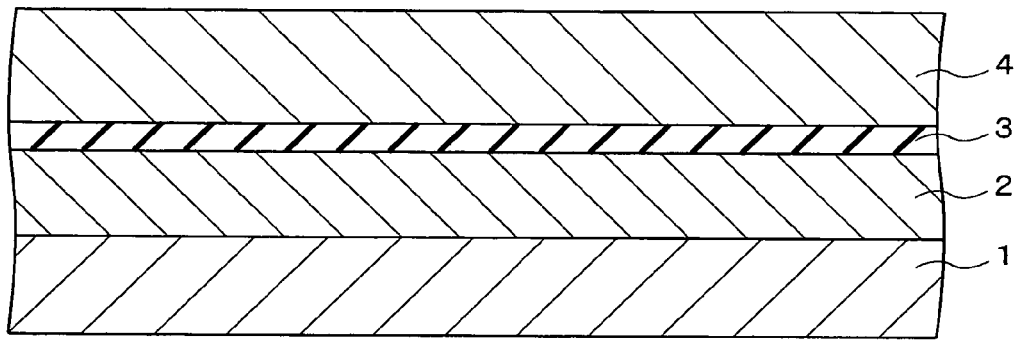
Figure 7C:
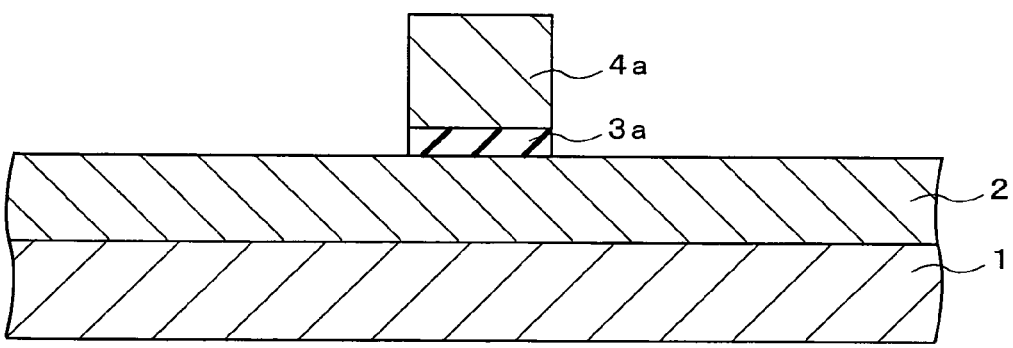

FIGS. 7A through 7C, FIGS. 8A through 8C, and FIGS. 9A through 9C are sectional views showing the sequence of steps in the method for manufacturing a MISFET according to a third embodiment of the present invention. First, a strained Si layer 2 is epitaxially grown on the base SiGe layer 1 (FIG. 7A). The film thickness of this strained Si layer 2 may be $2T_p$ or greater, where $T_p$ is the depth at which the impurity concentration of the source/drain of the final MISFET is at maximum. A gate insulating film 3 and a gate electrode film 4 are then grown thereon (FIG. 7B), after which patterning is performed, and a gate insulating film 3a and a gate electrode 4a having a length of 0.4 μm or less are formed (FIG. 7C).

Figure 9A:
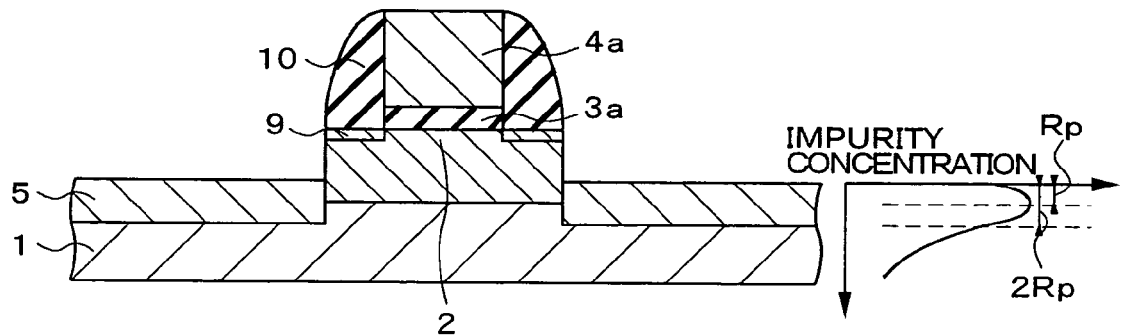
FIGS. 9A through 9C are sectional views showing the sequence of steps subsequent to the steps shown in FIG. 8 in the method for manufacturing a MISFET according to the third embodiment of the present invention.

An impurity for forming a source/drain extension region is then ion-implanted into the strained Si layer 2 using the gate electrode 4a as a mask, and an impurity-implanted region 9 is formed (FIG. 8A). In this instance, the implantation energy and dose are reduced compared to that of the ion implantation for forming the source/drain. This is done in order to form a shallower, steeper joint. A gate sidewall 10 is then formed by oxide film growth and back-etching (FIG. 8B). The strained Si layer 2 of the source/drain region is then etched back so as to have a film thickness of $2T_p$ or less (FIG. 8C). An impurity in an amount of $1 \times 10^{15}$ cm$^{-2}$ or higher is then ion-implanted using the gate electrode 4a and the gate sidewall 10 as masks. An impurity is thus introduced at high concentration into the source/drain region, and an amorphous layer 5 is formed (FIG. 9A). The depth thereof is $2R_p$ or greater, where $R_p$ is the depth at which the concentration of the impurity is at maximum.

Figure 9B:
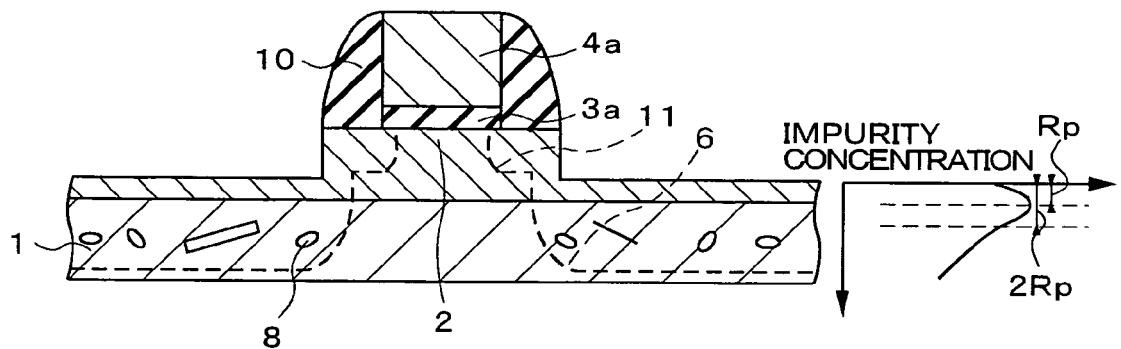
Figure 9C:
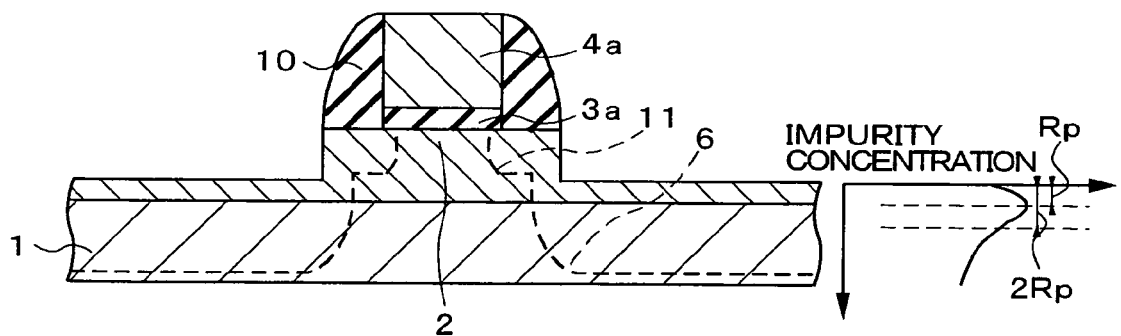

Heat treatment is then performed in order to activate the impurity. A source/drain region 6 and a source/drain extension region 11 are thus formed. The amorphous layer 5 also crystallizes, and dislocation loops 8 are formed directly underneath (FIG. 9B). However, the dislocation loops 8 are not formed in the strained Si layer 2, and all the loops are formed in the unstrained base SiGe layer 1. In this instance, dislocation loops are not formed directly under the impurity-implanted region 9. This is because the energy and dose are low in the ion implantation for forming the source/drain extension region, and there are insufficient surplus atoms for forming dislocation loops. Further heat treatment is performed in order to adequately activate the impurity. However, since the dislocation loops 8 are formed in the unstrained base SiGe layer 1, the dislocation loops 8 are removed or reduced in size, and U-shaped dislocations are not formed (FIG. 9C). Abnormal off-leakage currents therefore do not occur in the completed MISFET.

Fourth Embodiment

Figure 10A:
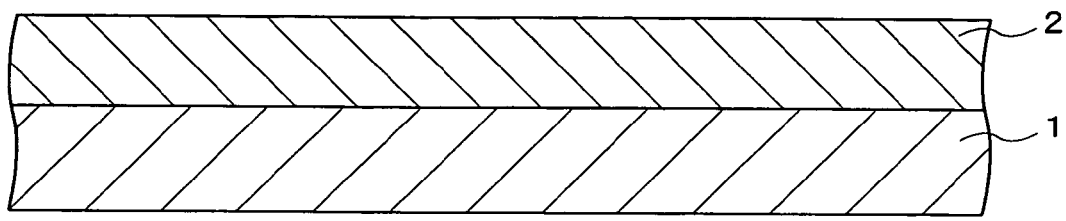
FIGS. 10A through 10C are sectional views showing the sequence of steps in the method for manufacturing a MISFET according to a fourth embodiment of the present invention.
Figure 10B:
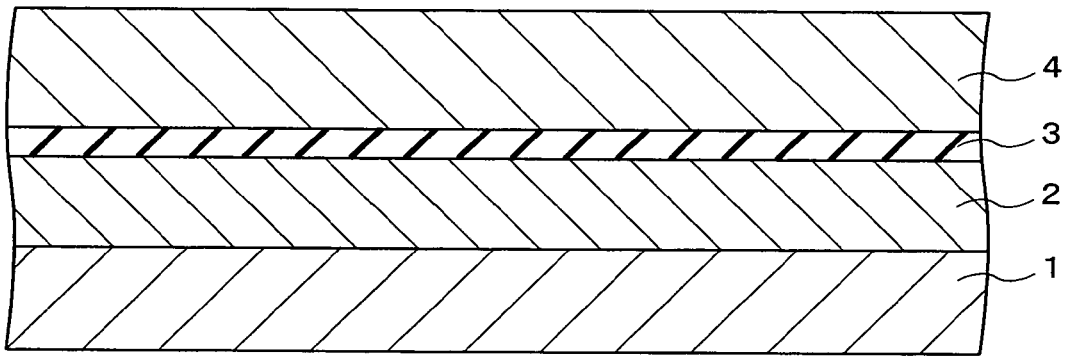
Figure 10C:
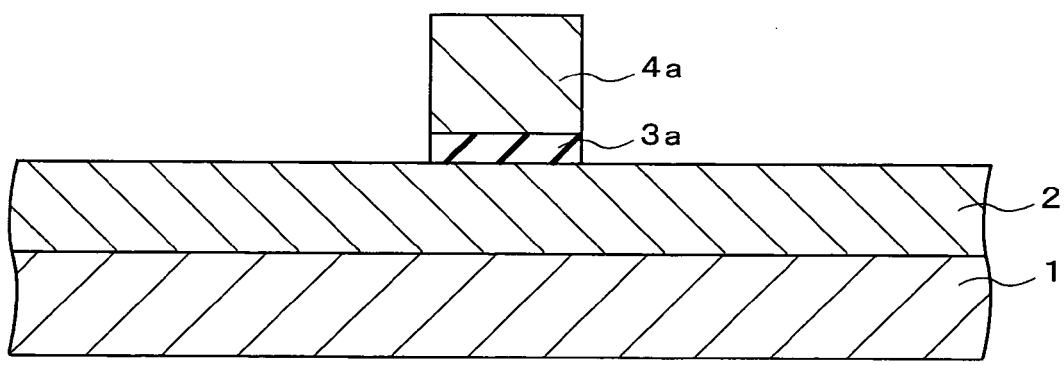

FIGS. 10A through 10C, FIGS. 11A through 11D, and FIGS. 12A and 12B are sectional views showing the sequence of steps in the method for manufacturing a MISFET according to a fourth embodiment of the present invention. First, a strained Si layer 2 is epitaxially grown on the base SiGe layer 1 (FIG. 10A). The film thickness of this strained Si layer 2 may be $2T_p$ or greater, where $T_p$ is the depth at which the impurity concentration of the source/drain of the final MISFET is at maximum. A gate insulating film 3 and a gate electrode film 4 are then grown thereon (FIG. 10B), after which patterning is performed, and a gate insulating film 3a and a gate electrode 4a having a length of 0.4 μm or less are formed (FIG. 10C).

Figure 11A:
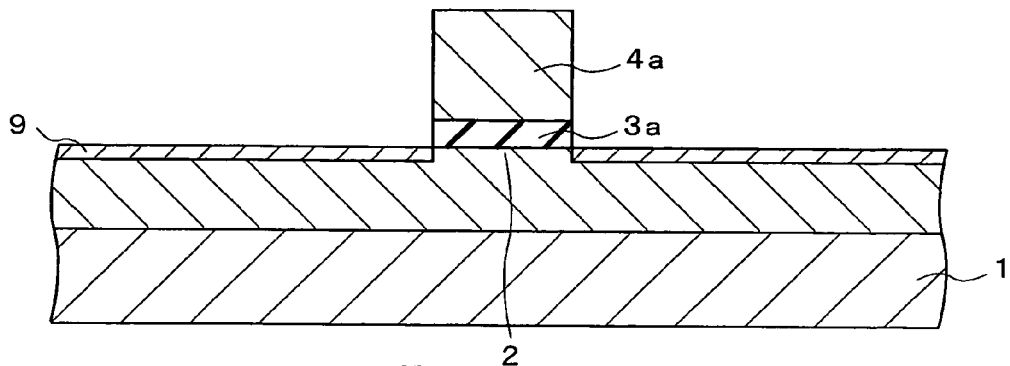
FIGS. 11A through 11D are sectional views showing the sequence of steps subsequent to the steps shown in FIG. 10 in the method for manufacturing a MISFET according to the fourth embodiment of the present invention.
Figure 11B:
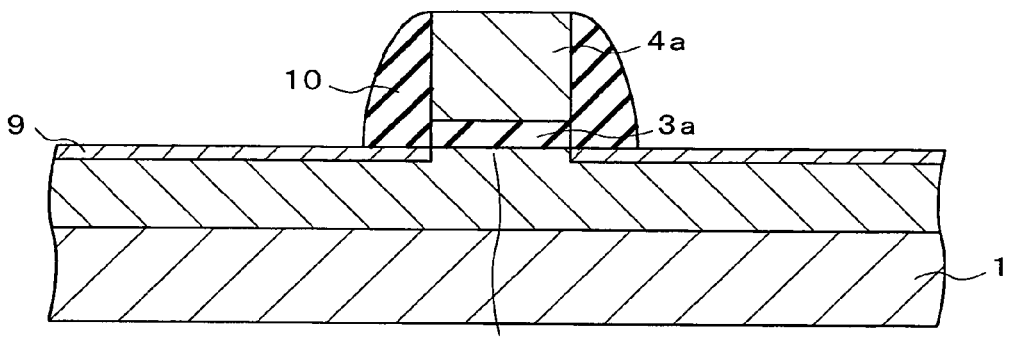
Figure 11C:
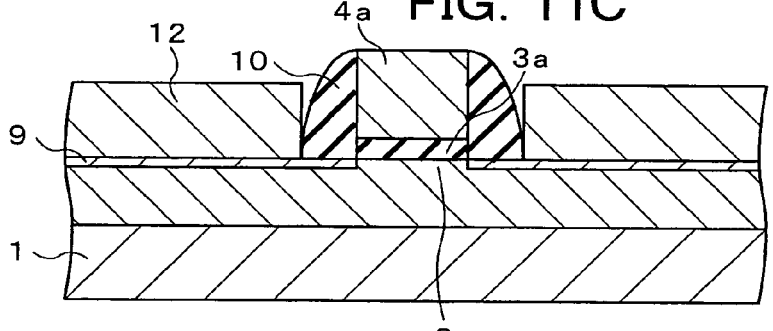

An impurity for forming a source/drain extension region is then ion-implanted using the gate electrode 4a as a mask, and an impurity-implanted region 9 is formed (FIG. 11A). In this instance, the implantation energy and dose are reduced compared to that of the ion implantation for forming the source/drain. This is done in order to form a shallower, steeper joint. A gate side wall 10 is then formed by oxide film growth and back-etching (FIG. 11B). A source/drain built-up region 12 is then formed in the source/drain region using a selective growth method (FIG. 11C). The film thickness thereof is $3T_p$ or greater and $5T_p$ or less.

Figure 11D:
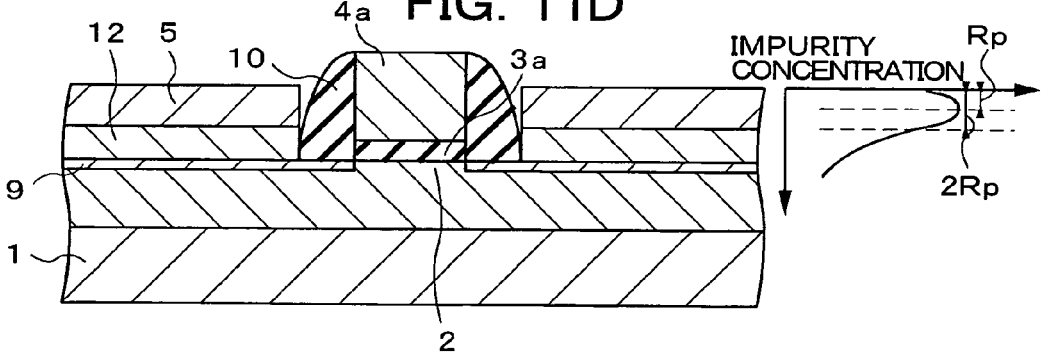
Figure 12A:
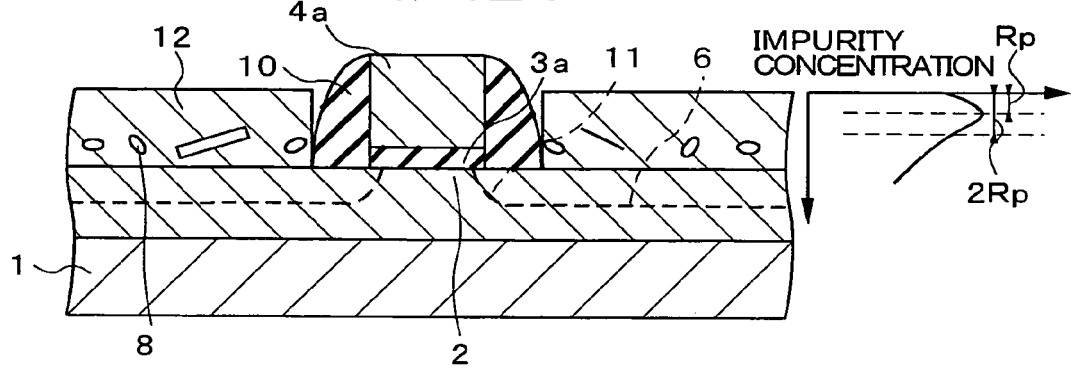
FIGS. 12A and 12B are sectional views showing the sequence of steps subsequent to the steps shown in FIG. 11 in the method for manufacturing a MISFET according to the fourth embodiment of the present invention.
Figure 12B:
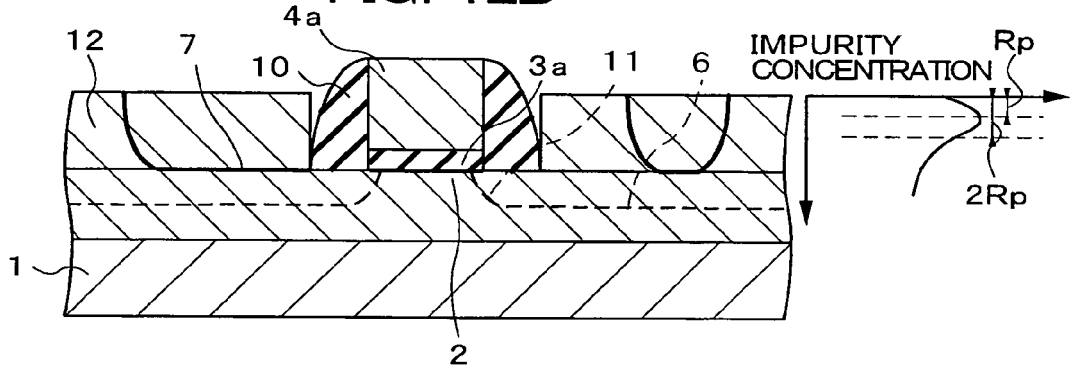

An impurity in an amount of $1 \times 10^{15}$ cm$^{-2}$ or higher is then ion-implanted using the gate electrode 4a and the gate side wall 10 as masks. An impurity is thus introduced at high concentration into the source/drain built-up region 12, and an amorphous layer 5 is formed (FIG. 11D). The depth thereof is $2.5R_p$ or less, where $R_p$ is the depth at which the concentration of the impurity is at maximum. Heat treatment is then performed in order to activate the impurity. A source/drain region 6 and a source/drain extension region 11 are thus formed. The amorphous layer 5 simultaneously crystallizes, and dislocation loops 8 are formed directly underneath (FIG. 12A). However, since the film thickness of the source/drain built-up region 12 is greater than $3T_p$, the dislocation loops 8 are not formed in the strained Si layer 2, and are all localized in the source/drain built-up region 12. The built-up film thickness is also less than $5T_p$. Therefore, the impurity diffuses throughout the source/drain built-up region 12, and the source/drain region 6 is formed continuously with the source/drain extension region 11 (FIG. 12A). In this instance, dislocation loops are not formed directly under the impurity-implanted region 9. This is because the energy and dose are low in the ion implantation for forming the source/drain extension region, and there are insufficient surplus atoms for forming dislocation loops. Further heat treatment is performed in order to adequately activate the impurity (FIG. 12B). However, since the dislocation loops 8 are localized in the source/drain built-up region 12, U-shaped dislocations are not formed in the strained Si layer 2 even when the dislocations are enlarged. Abnormal off-leakage currents therefore do not occur in the completed MISFET.

Fifth Embodiment

Figure 13:
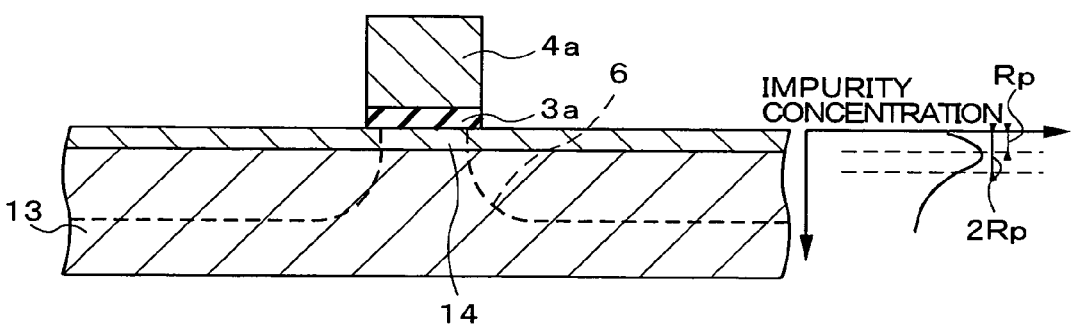
FIG. 13 is a sectional view of the MISFET according to a fifth embodiment of the present invention.

FIG. 13 is a sectional view of the MISFET according to a fifth embodiment of the present invention. The film thickness of the strained $Si_{1-x-y}Ge_xC_y$ layer 14 epitaxially grown on the base Si layer 13 is set to $2T_p$ or less, where $T_p$ is the depth at which the impurity concentration of the source/drain of the final MISFET is at maximum. Changing the channel material from strained Si to strained $Si_{1-x-y}Ge_xC_y$ (wherein $0 \leq x \leq 1$, $0 \leq y \leq 1$, and $0 < x+y \leq 1$) enables the hole mobility to be increased in particular.

Sixth Embodiment

Figure 14:
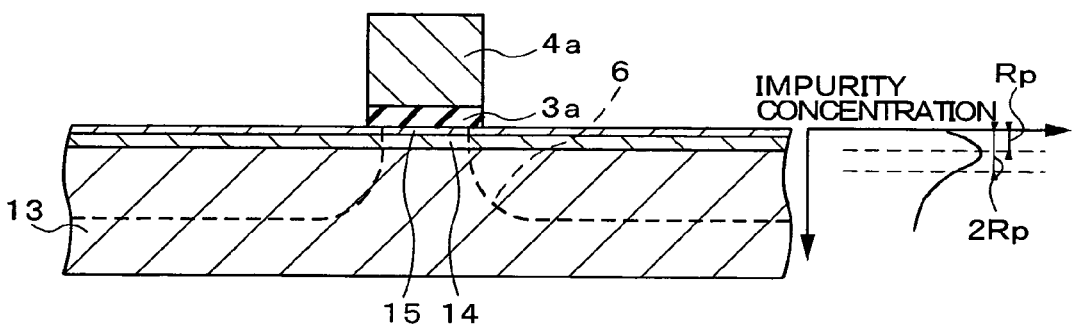
FIG. 14 is a sectional view of the MISFET according to a sixth embodiment of the present invention.

FIG. 14 is a sectional view of the MISFET according to a sixth embodiment of the present invention. The sum of the film thicknesses of a cap Si layer 15 and a strained $Si_{1-x-y}Ge_xC_y$ layer 14 epitaxially grown on the base Si layer 13 is set to $2T_p$ or less, where $T_p$ is the depth at which the impurity concentration of the source/drain of the final MISFET is at maximum. The cap Si layer 15 serves to enhance the reliability of the gate insulating film 3a. The cap Si layer 15 is given a film thickness of 10 nm or less. In this case, channels are formed not only in the cap Si layer 15, but also in the strained $Si_{1-x-y}Ge_xC_y$ layer 14, and the performance of the MISFET is enhanced.

Seventh Embodiment

Figure 15:
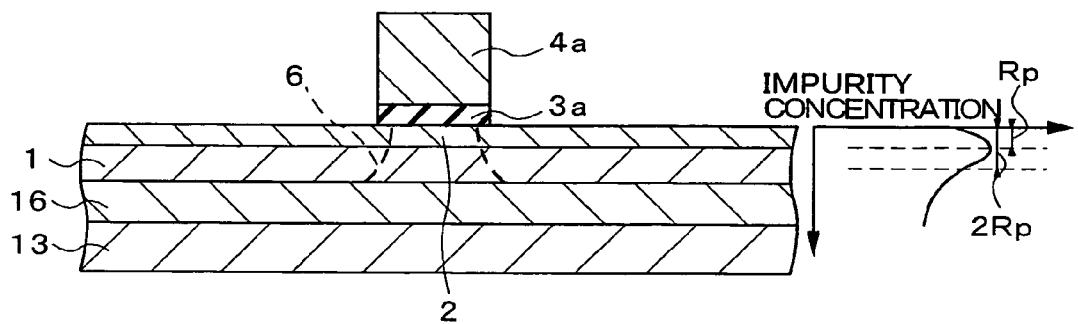
FIG. 15 is a sectional view of the MISFET according to a seventh embodiment of the present invention.

FIG. 15 is a sectional view of the MISFET according to a seventh embodiment of the present invention. The film thickness of the strained Si layer 2 epitaxially grown on the base SiGe layer 1 is set to $2T_p$ or less, where $T_p$ is the depth at which the impurity concentration of the source/drain of the final MISFET is at maximum.

An embedded oxide film 16 is formed between the base SiGe layer 1 and the base Si layer 13. This structure enables the parasitic capacitance of the source/drain region 6 to be reduced, and the performance of the MISFET to be enhanced.

Eighth Embodiment

Figure 16:
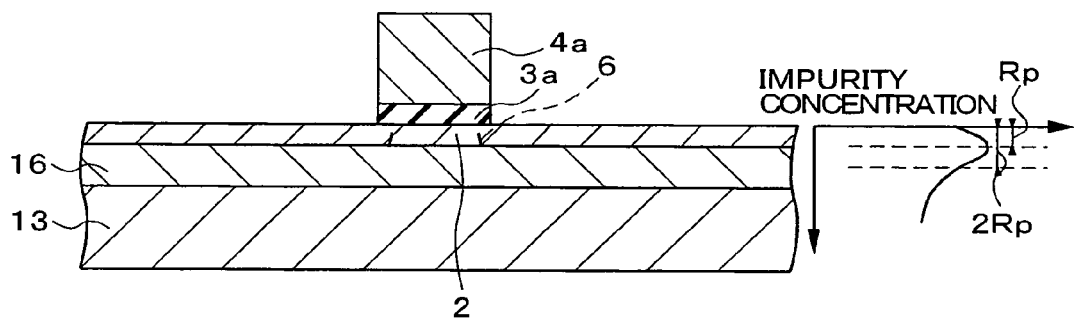
FIG. 16 is a sectional view of the MISFET according to an eighth embodiment of the present invention.
Figure 17:
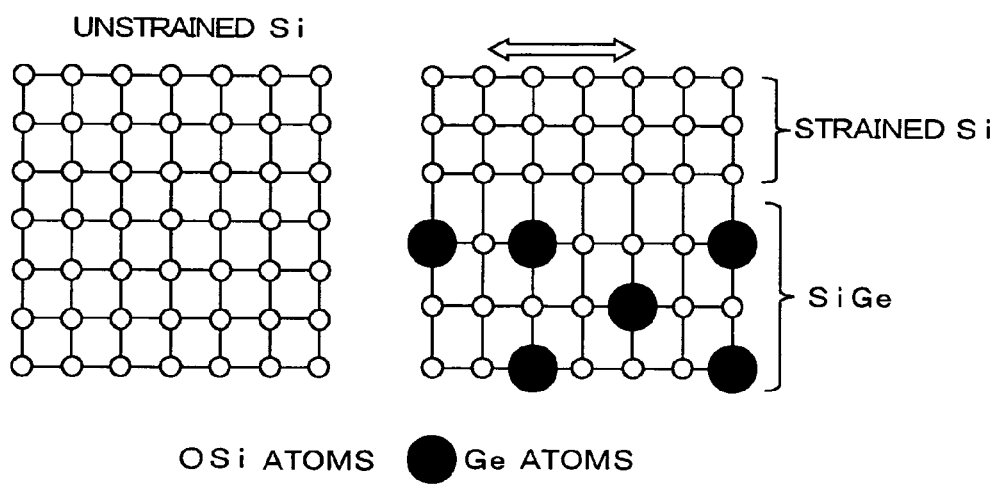
FIG. 17 is a diagram of the structure of the strained Si formed on the base SiGe layer.
Figure 18A:
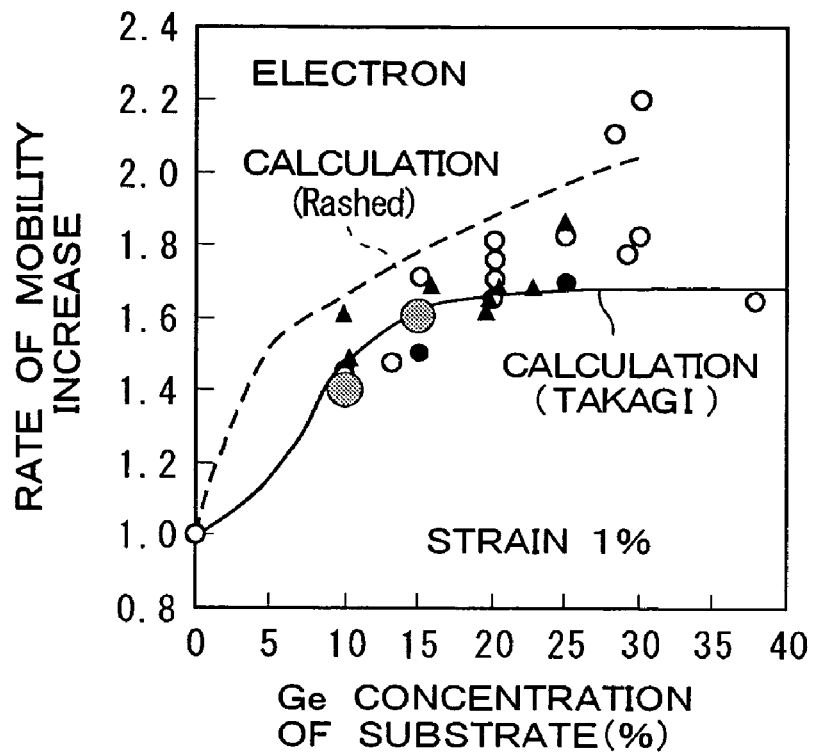
FIG. 18 is a graph showing the mobility increase rate of the strained-Si channel MISFET.
Figure 18B:
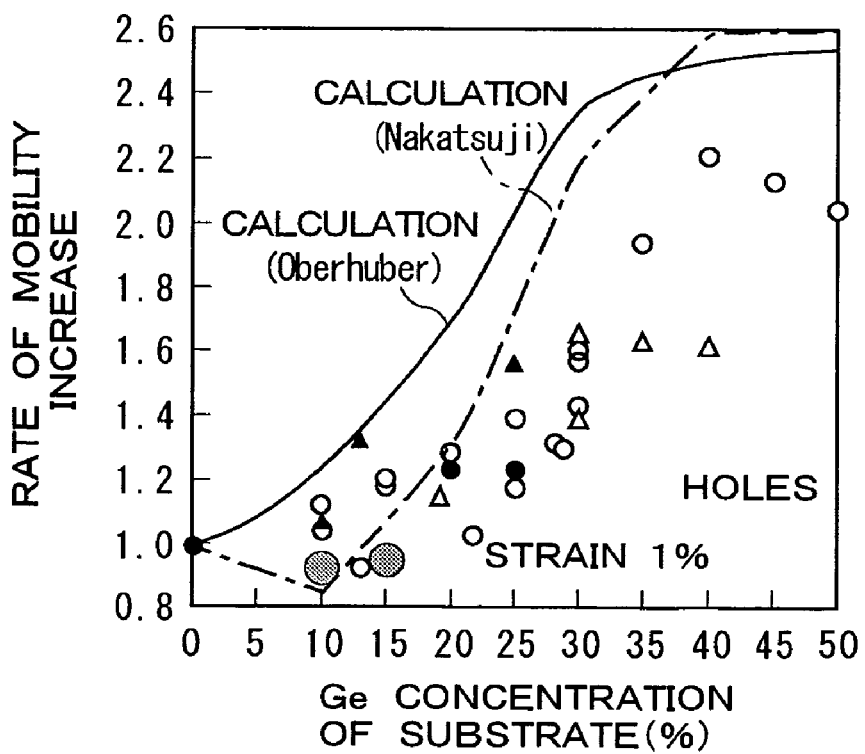
Figure 19A:
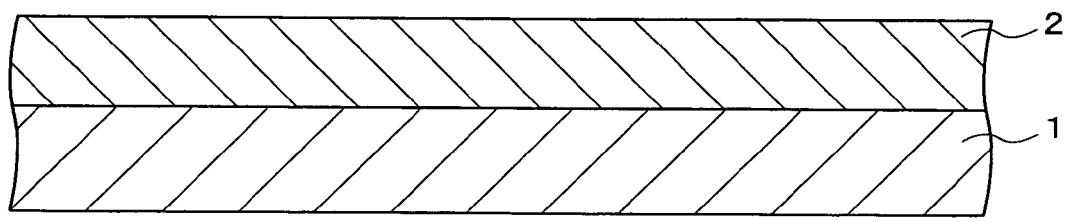
FIGS. 19A through 19C are sectional views showing the sequence of steps in the method for manufacturing a strained-Si channel MISFET having the conventional structure.
Figure 19B:
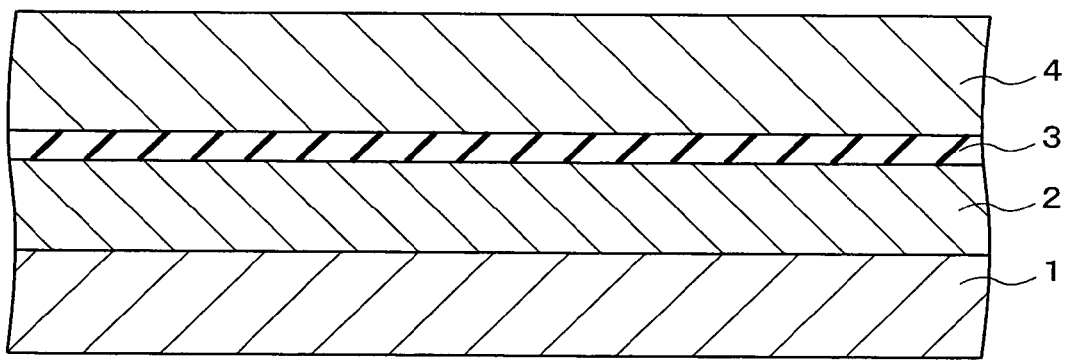
Figure 19C:
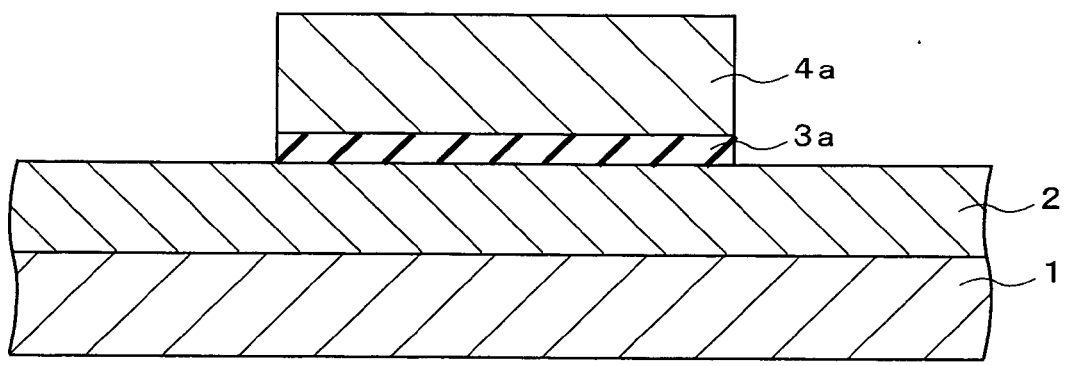
Figure 20A:
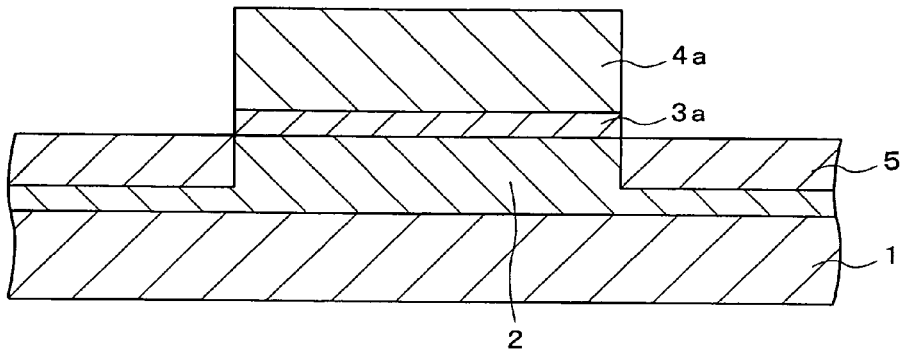
FIGS. 20A and 20B are sectional views showing the sequence of steps subsequent to the steps shown in FIG. 19 in the method for manufacturing a strained-Si channel MISFET having the conventional structure.
Figure 20B:
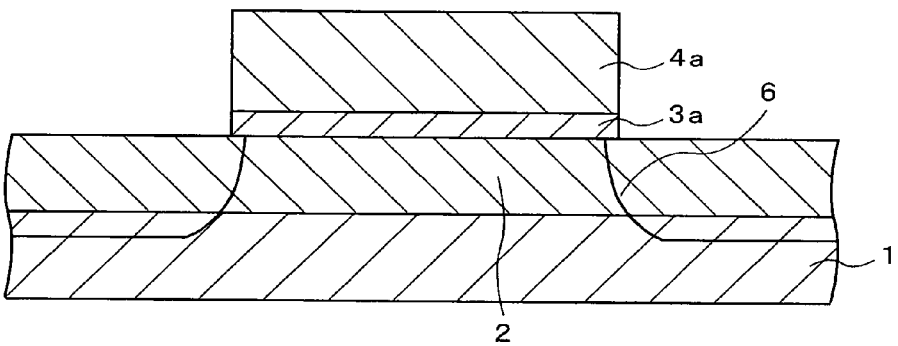
Figure 21:
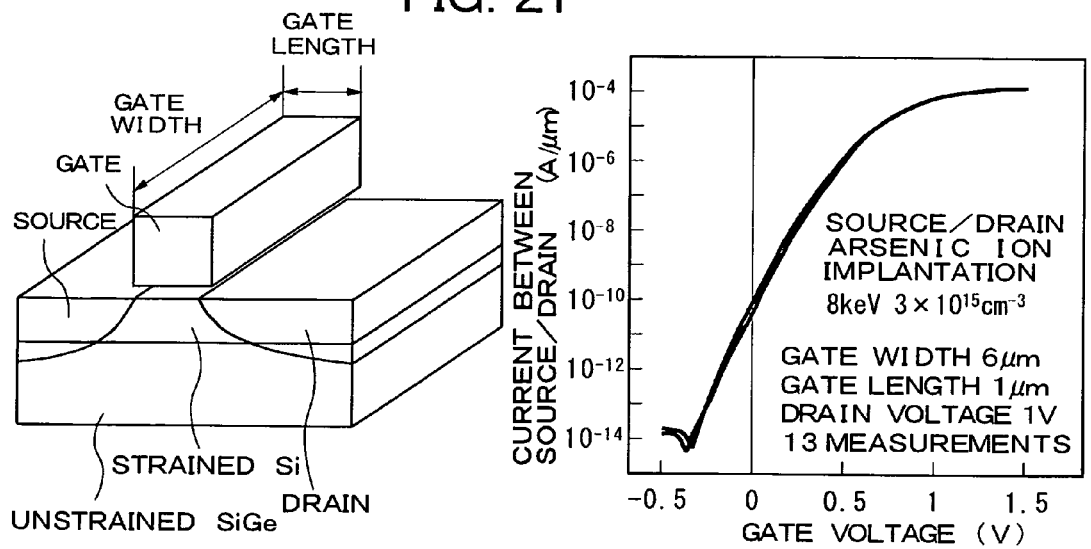
FIG. 21 is a graph showing the electrical characteristics of the strained-Si channel MISFET having the conventional structure.
Figure 22A:
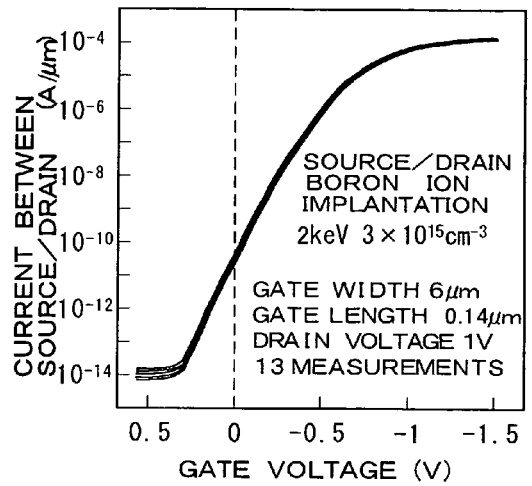
FIG. 22 is a graph showing the electrical characteristics when the gate length is reduced in a strained-Si channel MISFET having the conventional structure.
Figure 22B:
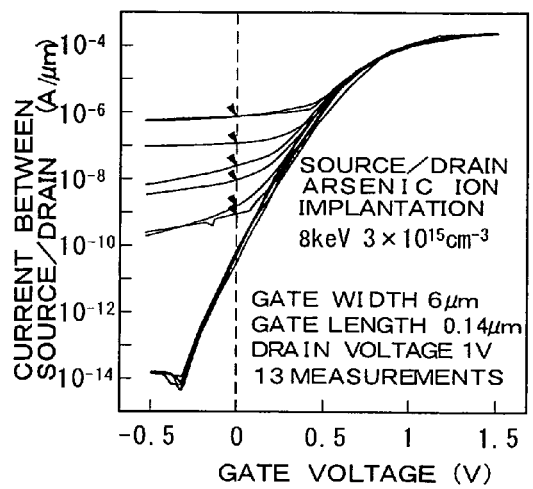

FIG. 16 is a sectional view of the MISFET according to an eighth embodiment of the present invention. An embedded oxide film 16 is present on the base Si layer 13, and a strained Si layer 2 is formed thereon. The film thickness of the strained Si layer 2 is set to $2T_p$ or less, where $T_p$ is the depth at which the impurity concentration of the source/drain of the final MISFET is at maximum.

This eighth embodiment differs from the seventh embodiment in that there is no base SiGe layer 1. This structure enables the parasitic capacitance of the source/drain 6 to be reduced even more than in the seventh embodiment, and enables an even greater improvement in the performance of the MISFET.

Preferred embodiments were described above, but the present invention is not limited by these embodiments and may be appropriately modified within a range that does not depart from the intended scope of the present invention. Embodiments of the present invention may also include any combination of the embodiments described above. For example, the fourth and fifth embodiments may be combined so that a source/drain built-up region 12 is formed on a strained $Si_{1-x-y}Ge_xC_y$ layer 14, and the fifth and eighth embodiments may be combined so that a strained $Si_{1-x-y}Ge_xC_y$ layer 14 is formed on an embedded oxide film 16.

INDUSTRIAL APPLICABILITY

The present invention is effective for preventing abnormal leak currents in a MISFET in which increased performance is realized through miniaturization.

The invention claimed is:
1. An MIS-type field-effect transistor comprising:
a base layer;
a strained active semiconductor layer formed on said base layer;
a gate insulating film formed on said strained active semiconductor layer;
a gate electrode formed on said gate insulating film; and
a source/drain region formed in portions on both sides of said gate electrode inside said strained active semiconductor layer; wherein
an interface between said base layer and said strained active semiconductor layer is at a depth of $2T_p$ or less from the surface, where $T_p$ is the depth of maximum concentration of an impurity introduced for forming said source/drain region.

2. An MIS-type field-effect transistor comprising:
a base layer;
a strained active semiconductor layer formed on said base layer;
a gate insulating film formed on said strained active semiconductor layer;
a gate electrode formed on said gate insulating film;
a source/drain region formed in portions on both sides of said gate electrode inside said strained active semiconductor layer; and
a gate side wall formed on the lateral face of said gate electrode; wherein
a portion of said strained active semiconductor layer under said gate side wall and said gate electrode of said strained active semiconductor layer has a greater film thickness than any other portion of said strained active semiconductor layer; and
an interface between said base layer and said strained active semiconductor layer is at a depth of $2T_p$ or less from the surface of a region disposed other than under said gate side wall and said gate electrode of said strained active semiconductor layer, where $T_p$ is the depth of maximum concentration of an impurity introduced for forming said source/drain region.

3. An MIS-type field-effect transistor comprising:
a base layer;
a strained active semiconductor layer formed on said base layer;
a gate insulating film formed on said strained active semiconductor layer;
a gate electrode formed on said gate insulating layer; and
a built-up layer provided with a source/drain region and formed on said strained active semiconductor layer on both sides of said gate electrode; wherein
said built-up layer has a film thickness of $3T_p$ or greater, where $T_p$ is the depth of maximum concentration of an impurity introduced for forming said source/drain region.

4. The MIS-type field-effect transistor according to claim 3, wherein the film thickness of said built-up layer is $5T_p$.

5. The MIS-type field-effect transistor according to claim 1, wherein said base layer is a semiconductor layer having the composition $Si_{1-x-y}Ge_xC_y$ (wherein $0 \leq x \leq 1$, $0 \leq y \leq 1$, and $0 < x+y \leq 1$).

6. The MIS-type field-effect transistor according to claim 1, wherein said base layer is an Si layer.

7. The MIS-type field-effect transistor according to claim 1, wherein said base layer is a semiconductor layer, and an insulator layer is formed underneath said base layer.

8. The MIS-type field-effect transistor according to claim 1, wherein said base layer is an insulator layer.

9. The MIS-type field-effect transistor according to claim 1, wherein said strained active semiconductor layer is a group IV semiconductor layer.

10. The MIS-type field-effect transistor according to claim 1, wherein said strained active semiconductor layer is an Si layer.

11. The MIS-type field-effect transistor according to claim 1, wherein said strained active semiconductor layer is a semiconductor layer having the composition $Si_{1-x-y}Ge_xC_y$ (wherein $0 \leq x \leq 1$, $0 \leq y \leq 1$, and $0 \leq x+y \leq 1$).

12. The MIS-type field-effect transistor according to claim 11, further comprising an Si layer with a film thickness of 10 nm or less between said strained active semiconductor layer and said gate insulating film.

13. The MIS-type field-effect transistor according to claim 1, wherein the MIS-type field effect transistor has a gate length of 0.4 µm or less.

14. The MIS-type field-effect transistor according to claim 1, wherein said source/drain region is formed by an ion implantation method.

15. The MIS-type field-effect transistor according to claim 1, wherein said source/drain region is formed by a plasma doping method.

16. The MIS-type field-effect transistor according to claim 1, wherein said source/drain region is formed by a gas-phase doping method.

17. The MIS-type field-effect transistor according to claim 1, wherein a portion of said source/drain region near the gate electrode is a region of low impurity concentration.

* * * * *

UNITED STATES PATENT AND TRADEMARK OFFICE
CERTIFICATE OF CORRECTION

PATENT NO. : 7,579,636 B2  Page 1 of 1
APPLICATION NO. : 10/585576
DATED : August 25, 2009
INVENTOR(S) : Kazuya Uejma It is certified that error appears in the above-identified patent and that said Letters Patent is hereby corrected as shown below:

On the Title Pg,

Item [*] Notice: Subject to any disclaimer, the term of this patent is extended or adjusted under 35 USC 154(b) by 380 days Delete the phrase "by 380 days" and insert -- by 428 days --

Signed and Sealed this

Eighteenth Day of May, 2010

David J. Kappos
*Director of the United States Patent and Trademark Office*